(12) United States Patent
Kim et al.

(10) Patent No.: US 12,349,546 B2
(45) Date of Patent: Jul. 1, 2025

(54) DISPLAY DEVICE

(71) Applicant: Samsung Display Co., Ltd., Yongin-Si (KR)

(72) Inventors: Eun Hyun Kim, Suwon-si (KR); Jaybum Kim, Yongin-si (KR); Kyoung Seok Son, Seoul (KR); Sunhee Lee, Seoul (KR); Jun Hyung Lim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 283 days.

(21) Appl. No.: 17/358,518

(22) Filed: Jun. 25, 2021

(65) Prior Publication Data

US 2022/0123075 A1 Apr. 21, 2022

(30) Foreign Application Priority Data

Oct. 16, 2020 (KR) .................. 10-2020-0134659

(51) Int. Cl.
*H10K 59/122* (2023.01)
*G06F 1/16* (2006.01)
*H10K 50/844* (2023.01)
*H10K 59/121* (2023.01)

(52) U.S. Cl.
CPC ......... *H10K 59/122* (2023.02); *G06F 1/1605* (2013.01); *H10K 50/844* (2023.02); *H10K 59/1213* (2023.02)

(58) Field of Classification Search
CPC .... H10K 59/122; H10K 59/88; H10K 59/131; H10K 59/65; H10K 59/1213; H10K 50/844; G06F 1/1605; G09G 3/3241
See application file for complete search history.

(56) References Cited

U.S. PATENT DOCUMENTS

| 2018/0040682 A1* | 2/2018 | Ebisuno ............... H10K 59/131 |
| 2019/0296099 A1* | 9/2019 | Lee ...................... H10K 50/844 |
| 2020/0119304 A1* | 4/2020 | Choi ..................... H10K 59/12 |

FOREIGN PATENT DOCUMENTS

KR 1020070072207 A 7/2007

* cited by examiner

*Primary Examiner* — Vongsavanh Sengdara
(74) *Attorney, Agent, or Firm* — CANTOR COLBURN LLP

(57) ABSTRACT

A display device includes a display area and a functional area defining a through-portion therein. At least a portion of the functional area is surrounded by the display area. The display device includes an insulation layer disposed on a base substrate and defining a disconnection portion in the functional area, a pixel array disposed on the base substrate in the display area, and a mask pattern including a metal oxide and extending along the disconnection portion in a plan view.

27 Claims, 28 Drawing Sheets

DISPLAY DEVICE

This application claims priority to Korean Patent Application No. 10-2020-0134659, filed on Oct. 16, 2020, and all the benefits accruing therefrom under 35 U.S.C. § 119, the content of which in its entirety is herein incorporated by reference.

BACKGROUND

1. Field

Embodiments relate to a display device. More particularly, embodiments relate a display device including a functional area within a display area.

2. Description of the Related Art

A display device includes a display area and a non-display area. The display area generates an image. At least one of a driver, a wiring and a functional module such as a camera module, a motion-detecting sensor or the like may be disposed in the non-display area.

The display device including a function module disposed in a functional area defined by a through-portion within the display area is being developed to reduce a bezel and to improve a design.

SUMMARY

Embodiments provide a display device with a reduced bezel and with a substantially expanded display area.

According to an embodiment, a display device includes a display area and a functional area defining a through-portion therein. At least a portion of the functional area is surrounded by the display area. The display device includes an insulation layer disposed on a base substrate and defining a disconnection portion in the functional area, a pixel array disposed on the base substrate in the display area, and a mask pattern including a metal oxide and extending along the disconnection portion in a plan view.

In an embodiment, the display device may further include a functional module. At least a portion of the functional module is disposed in the through-portion therein.

In an embodiment, the function module may include at least one of a camera module, a face recognition sensor module, an iris recognition sensor module, an acceleration sensor module, a geomagnetism sensor module, a near sensor module, an infrared ray (IR) sensor module and an illumination sensor module.

In an embodiment, the disconnection portion may have a shape surrounding the through-portion in the plan view.

In an embodiment, the base substrate may define a trench connected to the disconnection portion.

In an embodiment, the insulation layer may be disposed under the mask pattern.

In an embodiment, the insulation layer may partially cover the trench which defines an undercut structure.

In an embodiment, the display device may further include an encapsulation layer covering the pixel array and including at least an organic film, and a dam structure disposed in the functional area to control a boundary of the organic film.

In an embodiment, the disconnection portion and the mask pattern may be disposed between the dam structure and the display area In an embodiment, a portion of the organic film may be disposed in the disconnection portion.

In an embodiment, the disconnection portion and the mask pattern may be disposed between the dam structure and the through-portion.

In an embodiment, the display device may further include an overcoating layer disposed on the encapsulation layer and including an organic material. A portion of the overcoating layer may be disposed in the disconnection portion.

In an embodiment, the mask pattern may include a first portion and a second portion, which are spaced apart from each other.

In an embodiment, the pixel array may include a driving element including a metal oxide semiconductor.

In an embodiment, the metal oxide semiconductor may include the same material as the mask pattern.

In an embodiment, the pixel array may include a first active pattern including silicon, a first conductive pattern including a first gate electrode overlapping the first active pattern in the plan view, a second active pattern including a metal oxide, a second conductive pattern disposed under the second active pattern and including a lower second gate electrode, and a third conductive pattern disposed on the second active pattern and including an upper second gate electrode. The lower second gate electrode may overlap the second active pattern in the plan view. The upper second gate electrode may overlap the second active pattern in the plan view and be electrically connected to the lower second gate electrode.

In an embodiment, the pixel array may further include a fourth conductive pattern disposed on the third conductive pattern and including a horizontal transfer wiring, and a fifth conductive pattern disposed on the fourth conductive pattern and including a vertical transfer wiring. The horizontal transfer wiring may extend along a first direction. The vertical transfer wiring may extend along a second direction crossing the first direction and be electrically connected to the horizontal transfer wiring.

In an embodiment, the fourth conductive pattern may further include a first data line extending along the second direction. The horizontal transfer wiring may be electrically connected to a second data line spaced apart from the first data line.

In an embodiment, the pixel array may include an organic light-emitting diode, which includes a first electrode, an organic light-emitting layer disposed on the first electrode and a second electrode disposed on the organic light-emitting layer. A dummy layer including the same material as at least a portion of the organic light-emitting layer and the second electrode may be disposed in the functional area. The dummy layer may be disconnected by the disconnection portion.

According to an embodiment, a display device includes a base substrate including a through-portion therein, an insulation layer disposed on the base substrate and defining a disconnection portion, which surrounds the through-portion in a plan view, a pixel array disposed in the display area on the base substrate, and a mask pattern spaced apart from the pixel array and extending along the disconnection portion in the plan view.

According to an embodiment, a display device may include a display area and a functional area including a through-portion. At least a portion of the functional area may be surrounded by the display area. The display device may include a pixel array disposed on the base substrate in the display area and including an active pattern, and a metal oxide pattern surrounding the through-portion in the functional area. The active pattern may include a metal oxide.

According to embodiments, when a display device including a metal oxide semiconductor and having a functional area disposed in a display area is manufactured, a mask pattern may be formed from a metal oxide layer in the functional area. A trench of a base substrate may be formed in the functional area in an etching process for forming a pixel structure in the display area. Thus, the trench may be formed without an additional photolithography process.

BRIEF DESCRIPTION OF THE DRAWINGS

Aspects of one or more embodiments of the present inventive concept will be more clearly understood from the following detailed description taken in conjunction with the accompanying drawings.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. A display device according to embodiments of the present inventive concept will be described hereinafter with reference to the accompanying drawings, in which some embodiments are shown.

Figure 1:
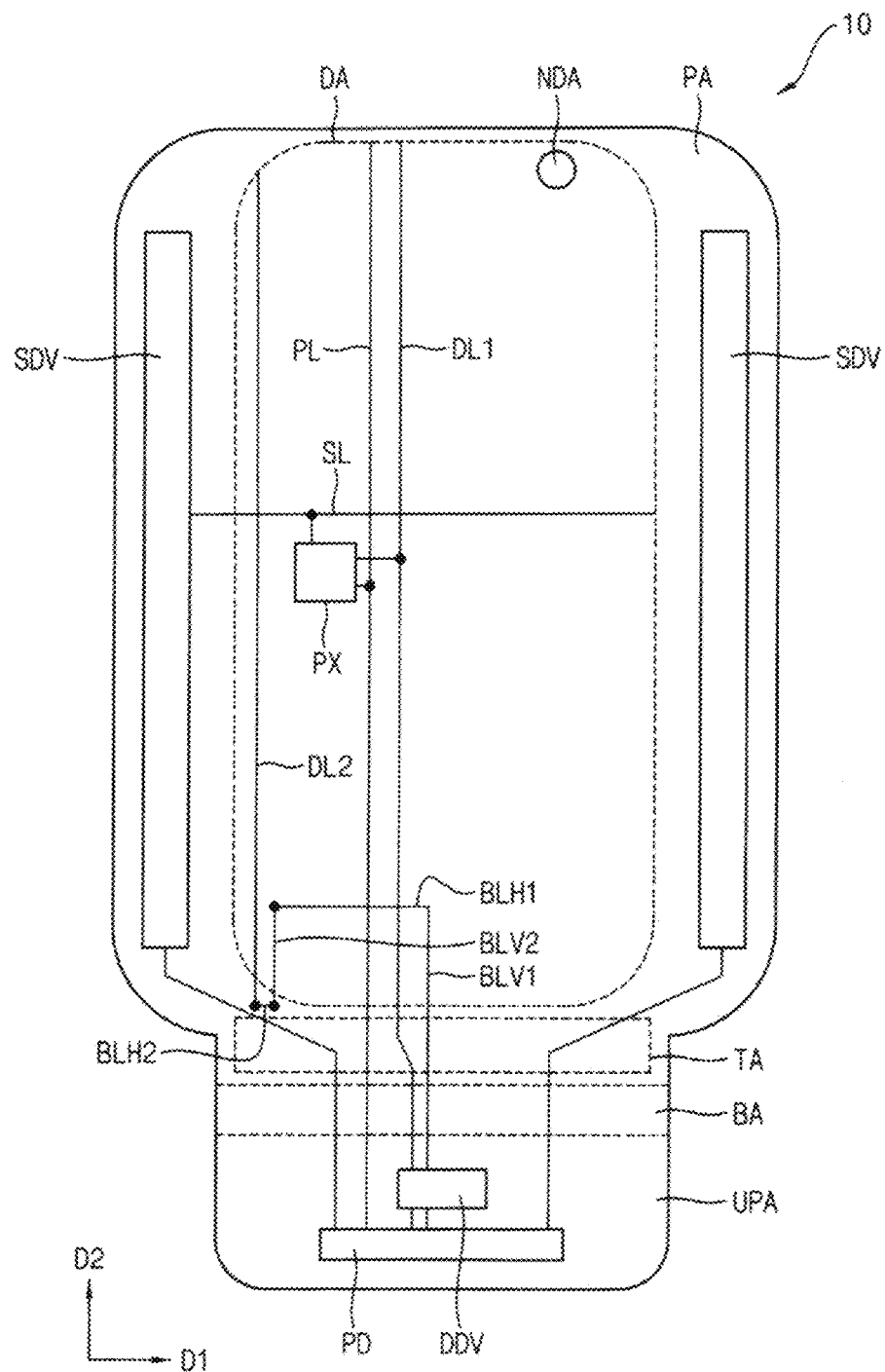
FIG. 1 is a plan view illustrating a display device according to an embodiment.
Figure 2:
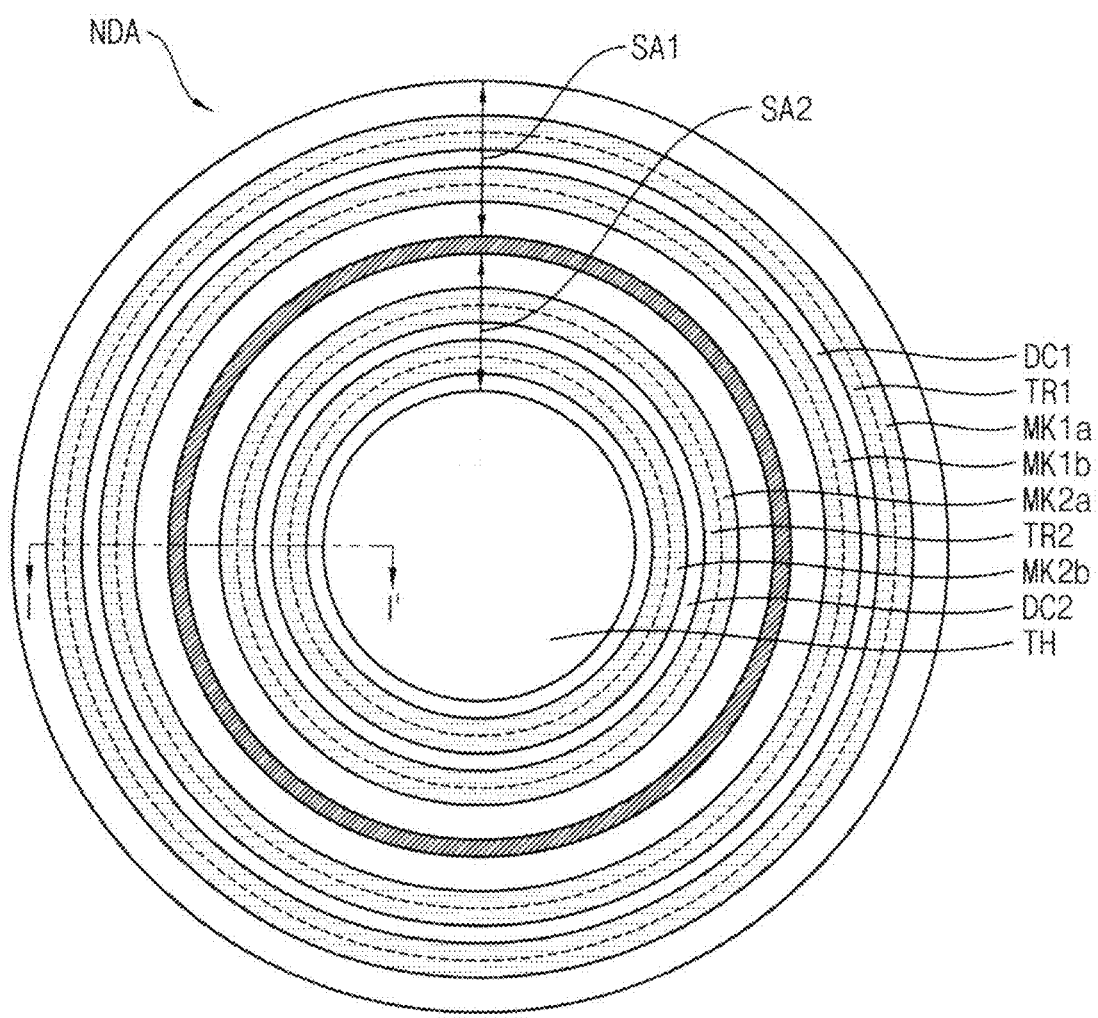
FIG. 2 is an enlarged plan view illustrating a functional area of a display device according to an embodiment.
Figure 3:
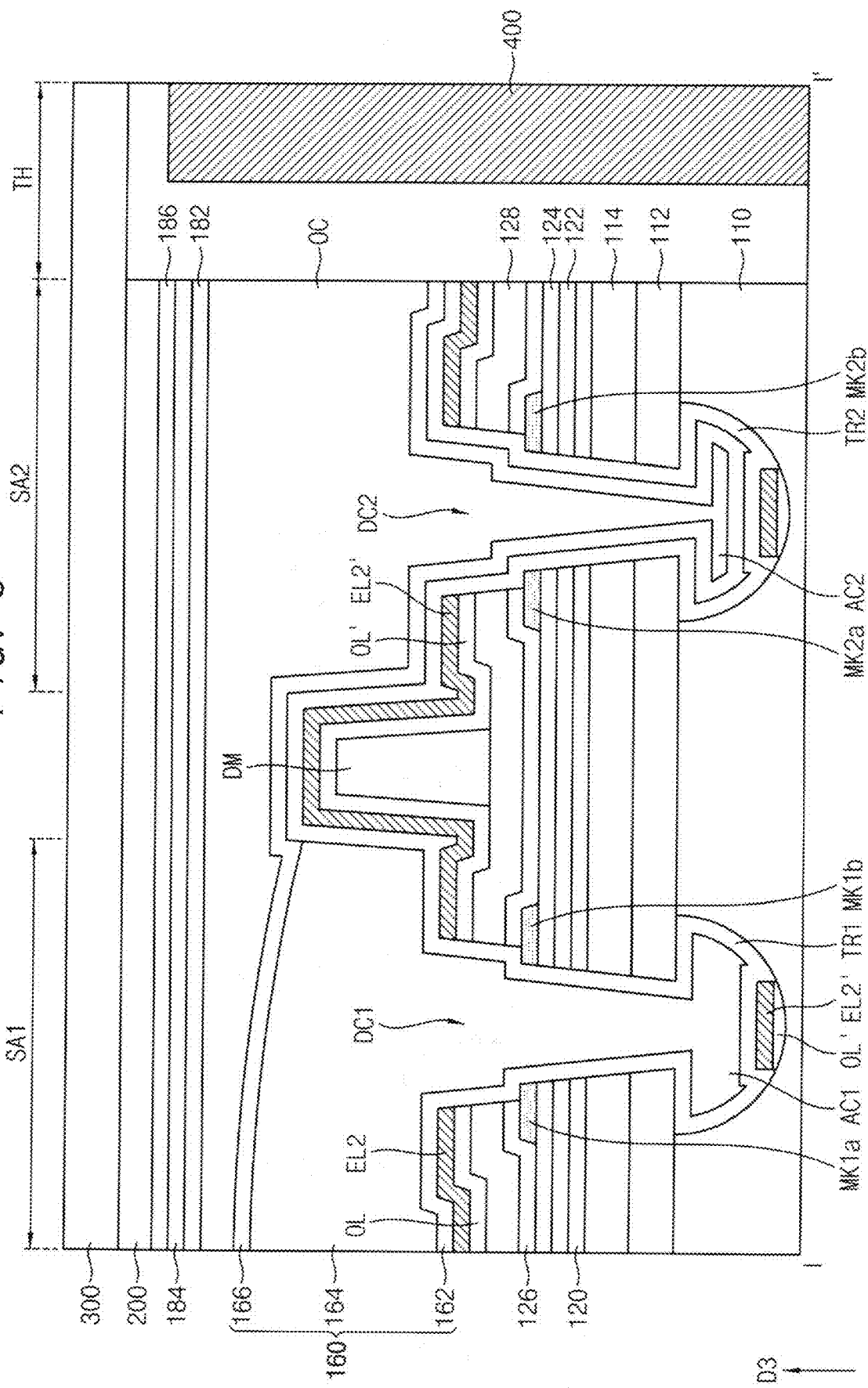
FIG. 3 is a cross-sectional view taken along line I-I' of FIG. 2.

FIG. 1 is a plan view illustrating a display device according to an embodiment. FIG. 2 is an enlarged plan view illustrating a functional area of a display device according to an embodiment. FIG. 3 is a cross-sectional view taken along line I-I' of FIG. 2.

Referring to FIG. 1, a display device 10 according to an embodiment includes a display panel. The display panel includes a display area DA in which a plurality of pixels PX are arranged to display an image. An area, which is adjacent to the display area DA and does not generate an image, may be referred to as a peripheral area PA. For example, the peripheral area PA may have a shape surrounding the display area DA.

In an embodiment, the display device 10 may include an organic light-emitting display panel. For example, each of the pixels PX may include a light-emitting element and a driving element electrically connected to the light-emitting element. In an embodiment, the light-emitting element may include an organic light-emitting diode, and the driving element may include at least one thin film transistor.

In an embodiment, the display panel may further include a rear-facing area UPA extending from a front-facing area including the display area DA and disposed under the front-facing area. The display panel may further include a bending area BA connecting the front-facing area and the rear-facing area UPA. At least a portion of an area between the bending area BA and the display area DA may be referred to as a transfer area TA. Transfer wirings may be disposed in the transfer area TA and the bending area BA to transfer a driving signal, a power or the like to the display area DA.

A scan line SL, a data line DL1 or DL2 and a power line PL, which are electrically connected to the pixels PX, may be disposed in the display area DA. For example, the scan line SL may extend along a first direction D1. The data line DL1 or DL2 and the power line PL may extend along a second direction D2 crossing the first direction D1. Each of the pixels PX may be connected to a plurality of scan lines. The scan lines may be referred to as gate lines.

In an embodiment, the display panel may include a connection wiring, of which at least a portion is disposed in the display area DA. For example, the connection wiring may transfer a data signal to some of data lines. For example, a first data line DL1 may receive a data signal directly from a transfer wiring disposed in the transfer area TA, and a second data line DL2 may receive a data signal from the connection wiring electrically connected to a transfer wiring.

At least a portion of the connection wiring may extend along the first direction D1 in the display area DA.

In an embodiment, for example, the connection wiring may include a first vertical extending portion BLV1 and a first horizontal extending portion BLH1. The first vertical extending portion BLV1 may extend along the second direction D2 in the display area DA. The first horizontal extending portion BLH1 may be electrically connected to the first vertical extending portion BLV1 and may extend along the first direction D1 in the display area DA. For example, the first horizontal extending portion BLH1 may cross the first data line DL1. The connection wiring may further include a second vertical extending portion BLV2 and a second horizontal extending portion BLH2. The second vertical extending portion BLV2 may be electrically connected to the first horizontal extending portion BLH1 and may extend toward the peripheral area PA along the second direction D2. The second horizontal extending portion BLH2 may be disposed in the peripheral area PA and may electrically contact the second vertical extending portion BLV2 and the second data line DL2.

The vertical extending portions BLV1 and BLV2 may be disposed in a different layer from the layer the horizontal extending portions BLH1 and BLH2 are disposed in. For example, the vertical extending portions BLV1 and BLV2 may be disposed in the same layer as the data lines DL1 and DL2, and the horizontal extending portions BLH1 and BLH2 may be disposed in a different layer from the layer the data lines DL1 and DL2 are disposed in. In an embodiment, the vertical extending portions BLV1 and BLV2 and the horizontal extending portions BLH1 and BLH2 may each include a plurality of patterns disposed in different layers.

A scan driver SDV may be disposed in the peripheral area PA. The scan driver SDV may provide a scan signal to the scan line SL. The scan driver SDV may include an integrated circuit formed with a driving element disposed in the display area DA.

In an embodiment, the rear-facing area UPA of the display panel may be connected to a driving device. For example, a driving chip DDV may be mounted on the rear-facing area UPA. For example, the driving chip DDV may include a data driver providing a data signal to the display panel. However, embodiments according to the invention are not limited thereto. For example, the driving chip DDV may be mounted on an individual substrate such as a flexible printed circuit board, and may be electrically connected to the rear-facing area UPA of the display panel (chip-on-film configuration).

A pad portion PD may be disposed in the rear-facing area UPA. The pad portion PD may include a plurality of connection pads. The pad portion PD may be electrically connected to a control device. For example, the control device may provide a control signal to the driving chip DDV. Furthermore, the control device may provide a power voltage, a scan driving signal or the like to the display panel. For example, the control device may include a printed circuit board, on which a controller is mounted.

Referring to FIGS. 1 to 3, the display device 10 includes a functional area NDA. In an embodiment, the functional area NDA may be defined as a non-display area disposed in the display area DA. For example, at least a portion of the functional area NDA may be surrounded by the display area DA adjacent thereto.

A functional module 400 may be disposed in the functional area NDA. Examples of the functional module 400 may include a camera module, a face recognition sensor module, an iris recognition sensor module, an acceleration sensor module, a geomagnetism sensor module, a near sensor module, an infrared ray (IR) sensor module, an illumination sensor module or the like. The camera module may be used for imaging an object in front of the display panel. The face recognition sensor module may be used for recognizing a face of a user. The iris recognition sensor module may be used for recognizing an iris of a user in front of the display panel. The acceleration sensor module and the geomagnetism sensor module may be used for determining movement of the display device 10. The near sensor module and IR sensor module may be used for sensing an object getting close to the display device 10. The illumination sensor module may be used for measuring an external brightness.

In an embodiment, for example, a through-portion TH passing through the display panel may be defined in the functional area NDA. At least a portion of the functional module 400 may be disposed in the through-portion TH. In an embodiment, the functional module 400 may include at least a camera module.

In an embodiment, the functional area NDA and the through-portion TH may have a circular shape, in a plan view. However, embodiments according to the invention are not limited thereto. For example, the functional area NDA and the through-portion TH may have various shapes such as a triangular shape, a rectangular shape, a rhombus shape, an oval shape or the like. Furthermore, the display device 10 may include a plurality of functional areas, or may include a plurality of through-portions defined in a single functional area.

Referring to FIGS. 2 and 3, the functional area NDA may include a blocking area surrounding the through-portion TH. For example, the functional area NDA may include a second blocking area SA2 surrounding the through-portion TH and a first blocking area SA1 surrounding the second blocking area SA2. Thus, the first blocking area SA1 may be disposed between the second blocking area SA2 and the display area DA surrounding the first blocking area SA1.

A first trench TR1 may be defined in the first blocking area SA1, and a second trench TR2 may be defined in the second blocking area SA2. The first trench TR1 and the second trench TR2 may be defined at a base substrate 110 of the display panel.

The first trench TR1 and the second trench TR2 may each have a shape surrounding the through-portion TH, in a plan view.

The first trench TR1 may be connected to a first disconnection portion DC1. The second trench TR2 may be connected to a second disconnection portion DC2. The first disconnection portion DC1 and the second disconnection portion DC2 may be defined by areas where inorganic layers on the base substrate 110 are continuously removed in the first blocking area SA1 and the second blocking area SA2, respectively. For example, the first disconnection portion DC1 may extend along the first blocking area SA1 to surround the second blocking area SA2, in a plan view. The second disconnection portion DC2 may extend along the second blocking area SA2 to surround the through-portion TH, in a plan view. The first disconnection portion DC1 and the second disconnection portion DC2 may be connected to the first trench TR1 and the second trench TR2, which are disposed thereunder, respectively.

In an embodiment, an encapsulation layer 160 may be disposed in the first blocking area SA1. The encapsulation layer 160 may extend from the display area DA. A portion of the encapsulation layer 160 may be disposed in the first disconnection portion DC1 and the first trench TR1. For example, a first inorganic film 162 of the encapsulation layer 160 may extend along an inner surface of the first trench TR1.

A portion of an organic film 164 of the encapsulation layer 160 may be disposed in the first trench TR1. The portion of an organic film 164 of the encapsulation layer, which is disposed in the first trench TR1, may be referred to as a first filling portion AC1. In an embodiment, a maximum width of the first filling portion AC1 in the first direction D1 or the second direction D2 may be larger than a maximum width of the first disconnection portion DC1 in the same direction. Thus, the first filling portion AC1 and a portion of the organic film 164, which is disposed in the first disconnection portion DC1, may form an anchor shape in which a width of a lower portion is larger than a width of an upper portion.

In an embodiment, an overcoating layer OC may be disposed in the second blocking area SA2. The overcoating layer OC may extend from the display area DA. A portion of the encapsulation layer 160 may be disposed in the second disconnection portion DC2 and the second trench TR2. For example, the first inorganic film 162 and a second inorganic film 166 of the encapsulation layer 160 may extend along an inner surface of the second trench TR2.

A portion of the overcoating layer OC may be disposed in the second trench TR2. The portion of the overcoating layer OC, which is disposed in the second trench TR2, may be referred to as a second filling portion AC2. In an embodiment, a width of the second filling portion AC2 in the first direction D1 or the second direction D2 may be larger than a width of the second disconnection portion DC2 in the same direction. Thus, the second filling portion AC2 and a portion of the overcoating layer OC, which is disposed in the second disconnection portion DC2, may form an anchor shape in which a width of a lower portion is larger than a width of an upper portion.

A common layer of an organic light-emitting diode may be disposed in the functional area NDA. For example, a dummy layer OL' or EL2', which is formed from the same layer as at least a portion of a light-emitting organic layer OL and a second electrode EL2 of the organic light-emitting diode, may be disposed in the functional area NDA.

The dummy layer OL' or EL2' may be disconnected from an neighboring dummy layer, the light-emitting organic layer OL and the second electrode EL2 by the disconnection portions DC1 and DC2. Even if the dummy layer OL' or EL2' extends vertically along the location of the disconnection portions DC1 and DC2 before the disconnection portions DC1 and DC2 are defined, the dummy layer OL' or EL2' may not be formed on an inner side surface of the trenches TR1 and TR2 and on a lower surface of a barrier layer 112, which partially covers the trenches TR1 and TR2 because the common layer with the dummy layer OL' or EL2' is anisotropic-deposited in a vacuum deposition process. Thus, the dummy layer OL' or EL2' may be clearly disconnected from neighboring common layer by the trenches TR1 and TR2. A portion of the dummy layer OL' or EL2' may be disposed on a bottom surface of the trenches TR1 and TR2.

Thus, penetration of humidity or progress of corrosion along the common layer to the display area DA from an area adjacent to the through-portion TH may be prevented.

Furthermore, because the overcoating layer OC and the organic film 164 of the encapsulation layer 160 form an anchor shape disposed in the trenches TR1 and TR2, the overcoating layer OC and the encapsulation layer 160 may be stably combined with the base substrate 110. Thus, separation of the overcoating layer OC and the encapsulation layer 160 from the base substrate 110 due to an external force applied thereto in a following process may be effectively prevented.

In an embodiment, at least one mask pattern may be disposed in an area adjacent to the disconnection portions DC1 and DC2. The mask pattern may be referred to as a metal oxide pattern.

In an embodiment, a first mask pattern is disposed in the first blocking area SA1 to overlap the first disconnection portion DC1 in a plan view (i.e., view in a third direction D3). Here, the third direction D3 is a thickness direction and perpendicular to a plane defined by the first direction D1 and the second direction D2. The first mask pattern includes a first portion MK1a and a second portion MK1b, which are spaced apart by the first disconnection portion DC1. The first portion MK1a and the second portion MK1b may each surround the through-portion TH, in a plan view.

A second mask pattern is disposed in the second blocking area SA2 to overlap the second disconnection portion DC2 in a plan view. The second mask pattern includes a first portion MK2a and a second portion MK2b, which are spaced apart by the second disconnection portion DC2. The first portion MK2a and the second portion MK2b may each surround the through-portion TH, in a plan view.

In an embodiment, the mask patterns may include a metal oxide.

In an embodiment, a dam structure DM is disposed between the first blocking area SA1 and the second blocking area SA2. The dam structure DM may control a liquid composition for forming the organic film 164 of the encapsulation layer 160 and may prevent overflowing of the liquid composition. Thus, the organic film 164 may be prevented from extending into the second blocking area SA2.

Embodiments according to the invention are not limited to the above illustrated configuration. For example, at least one of the first trench TR1, the second trench TR2 and the dam structure DM may be provided in plural.

In an embodiment, a barrier layer 112, a buffer layer 114, a first insulation layer 120, a second insulation layer 122, a third insulation layer 124, a fourth insulation layer 126 and a fifth insulation layer 128 may be disposed on the base substrate 110 in the blocking areas SA1 and SA2. A lower passivation layer 182, a touch insulation layer 184, a touch protective layer 186 and a polarization layer 200 may be disposed on the overcoating layer OC. The above elements will be explained more fully with a method for manufacturing a display device according to an embodiment.

Figure 4:
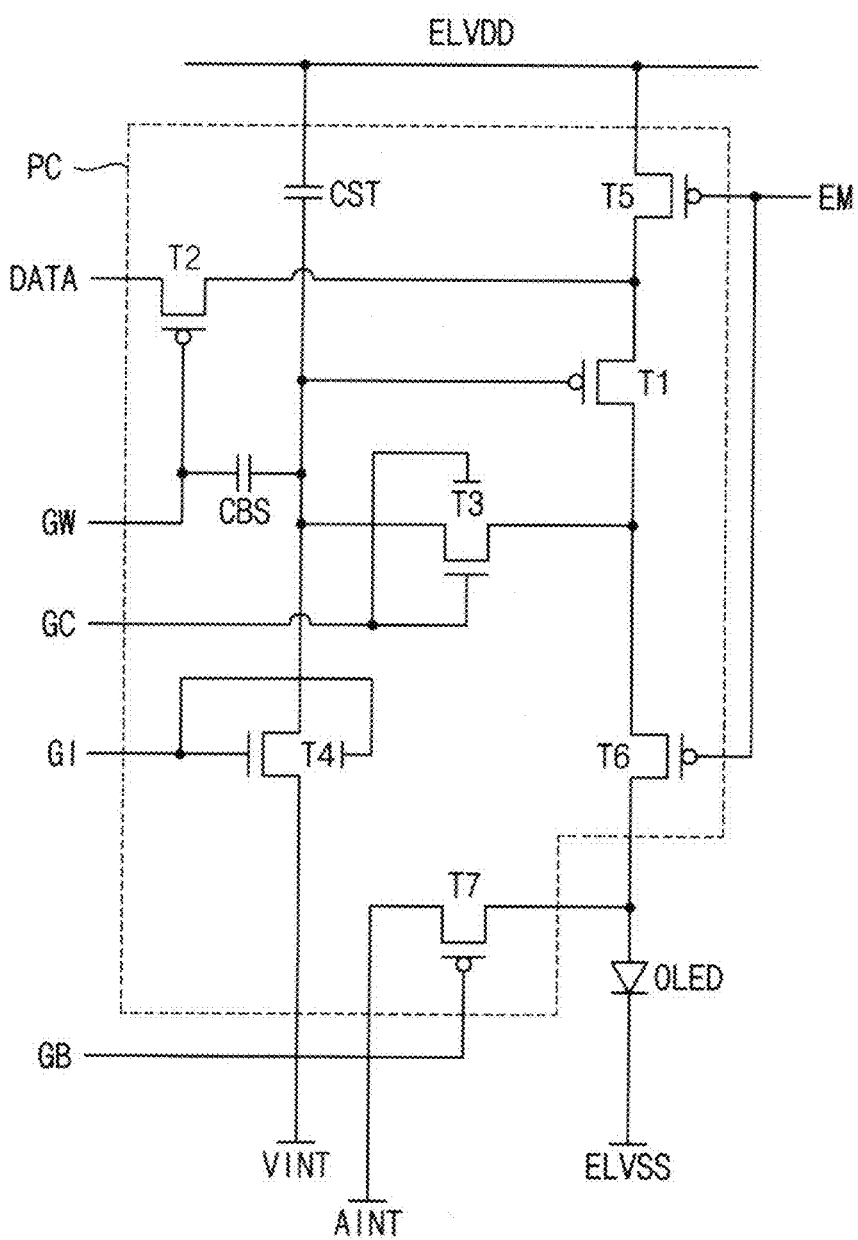
FIG. 4 is a circuit diagram illustrating a pixel circuit of a display device according to an embodiment.

FIG. 4 is a circuit diagram illustrating a pixel circuit of a display device according to an embodiment.

Referring to FIG. 4, a pixel circuit PC may include a first transistor T1, a second transistor T2, a third transistor T3, a fourth transistor T4, a fifth transistor T5, a sixth transistor T6, and a seventh transistor T7, a storage capacitor CST, and a boosting capacitor CBS. The pixel circuit PC may be electrically connected to an organic light emitting diode OLED to provide a driving current to the organic light emitting diode OLED.

The organic light emitting diode OLED may include a first terminal (e.g., an anode terminal) and a second terminal (e.g., a cathode terminal). The first terminal of the organic light emitting diode OLED may be connected to the first transistor T1 through the transistor T6 to receive the driving current, and the second terminal of the organic light emitting diode OLED may receive a low power voltage ELVSS. The organic light emitting diode OLED may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive a high power voltage ELVDD.

The boosting capacitor CBS may include a first terminal and a second terminal. The first terminal of the boosting capacitor CBS may be connected to the first terminal of the storage capacitor CST, and the second terminal of the boosting capacitor CBS may receive a first gate signal GW. The boosting capacitor CBS may compensate for the voltage drop of a gate terminal of the first transistor T1 by increasing the voltage of the gate terminal of the first transistor T1, when the provision of the first gate signal GW is stopped.

The first transistor T1 may include a gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 to receive a data voltage DATA. The second terminal of the first transistor T1 may provide the driving current to the organic light emitting diode OLED. The first transistor T1 may generate the driving current based on a voltage difference between the gate terminal and the first terminal. For example, the first transistor T1 may be referred to as a driving transistor. In an embodiment, the first transistor T1 may further include a back-gate terminal. For example, the back-gate terminal of the first transistor T1 may be synchronized with the gate terminal or the first terminal of the first transistor T1 or may be electrically floating. The back-gate terminal of the first transistor T1 may overlap the gate terminal and may be implemented under the gate terminal in a plan view.

The second transistor T2 may include a gate terminal, a first terminal (e.g., a source terminal), and a second terminal (e.g., a drain terminal). The gate terminal of the second transistor T2 may receive the first gate signal GW. The first terminal of the second transistor T2 may receive the data voltage DATA. The second terminal of the second transistor T2 may provide the data voltage DATA to the first terminal of the first transistor T1 while the second transistor T2 is turned on.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. For example, the second transistor T2 may be referred to as a switching transistor.

The third transistor T3 may include a gate terminal, a back-gate terminal, a first terminal (e.g., a source terminal), and a second terminal (e.g., a drain terminal). The gate terminal and the back-gate terminal of the third transistor T3 may receive a second gate signal GC. As the third transistor T3 has a dual-gate structure, reliability of the third transistor T3 may be improved. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an NMOS transistor, the third transistor T3 may be turned on when the second gate signal GC has a positive voltage level, and may be turned off when the second gate signal GC has a negative voltage level.

While the third transistor T3 is turned on in response to the second gate signal GC, the third transistor T3 may diode-connect the first transistor T1. When the first transistor T1 is diode-connected, a voltage difference equal to a threshold voltage of the first transistor T1 may occur between the gate terminal of the first transistor T1 and the first terminal of the first transistor T1. Thus, the data voltage DATA compensated by the voltage difference may be provided to the gate terminal of the first transistor T1. Thus, the third transistor T3 may compensate for the threshold voltage of the first transistor T1. For example, the third transistor T3 may be referred to as a compensation transistor.

The fourth transistor T4 may include a gate terminal, a back-gate terminal, a first terminal (e.g., a source terminal), and a second terminal (e.g., a drain terminal). The gate terminal and the back-gate terminal of the fourth transistor T4 may receive a third gate signal GI. As the fourth transistor T4 has a dual-gate structure, reliability of the fourth transistor T4 may be improved. The first terminal of the fourth transistor T4 may be connected to the gate terminal of the first transistor T1. The second terminal of the fourth transistor T4 may receive the initialization voltage VINT. The second terminal of the fourth transistor T4 may be electrically connected to the gate terminal of the first transistor T1.

The fourth transistor T4 may be turned on or off in response to the third gate signal GI. For example, when the fourth transistor T4 is an NMOS transistor, the fourth transistor T4 may be turned on when the third gate signal GI has a positive voltage level, and may be turned off when the third gate signal GI has a negative voltage level.

While the fourth transistor T4 is turned on in response to the third gate signal GI, the initialization voltage VINT may be provided to the gate terminal of the first transistor T1. Thus, the fourth transistor T4 may initialize the gate terminal of the first transistor T1 to the initialization voltage VINT. For example, the fourth transistor T4 may be referred to as an initialization transistor.

The fifth transistor T5 may include a gate terminal, a first terminal (e.g., a source terminal), and a second terminal (e.g., a drain terminal). The gate terminal of the fifth transistor T5 may receive an emission control signal EM. The first terminal of the fifth transistor T5 may receive the high power voltage ELVDD. The second terminal of the fifth transistor T5 may be connected to the first terminal of the first transistor T1. When the fifth transistor T5 is turned on in response to the emission control signal EM, the fifth transistor T5 may provide the high power voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the second terminal of the first transistor T1. The second terminal of the sixth transistor T6 may be connected to the first terminal of the organic light emitting diode OLED. When the sixth transistor T6 is turned on in response to the emission control signal EM, the sixth transistor T6 may provide the driving current generated by the first transistor T1 to the organic light emitting diode OLED.

The seventh transistor T7 may include a gate terminal, a first terminal (e.g., a source terminal), and a second terminal (e.g., a drain terminal). The gate terminal of the seventh transistor T7 may receive a fourth gate signal GB. The first terminal of the seventh transistor T7 may receive the anode initialization voltage AINT. The second terminal of the seventh transistor T7 may be connected to the first terminal of the organic light emitting diode OLED. When the seventh transistor T7 is turned on in response to the fourth gate signal GB, the seventh transistor T7 may provide the anode initialization voltage AINT to the organic light emitting diode OLED. Thus, the seventh transistor T7 may initialize the first terminal of the organic light emitting diode OLED to the anode initialization voltage AINT. For example, the seventh transistor T7 may be referred to as an anode initialization transistor.

The configuration of the pixel circuit PC illustrated in FIG. 4 is provided as an example for explaining an embodiment, and embodiment may include various configurations for a pixel circuit.

Figure 9:
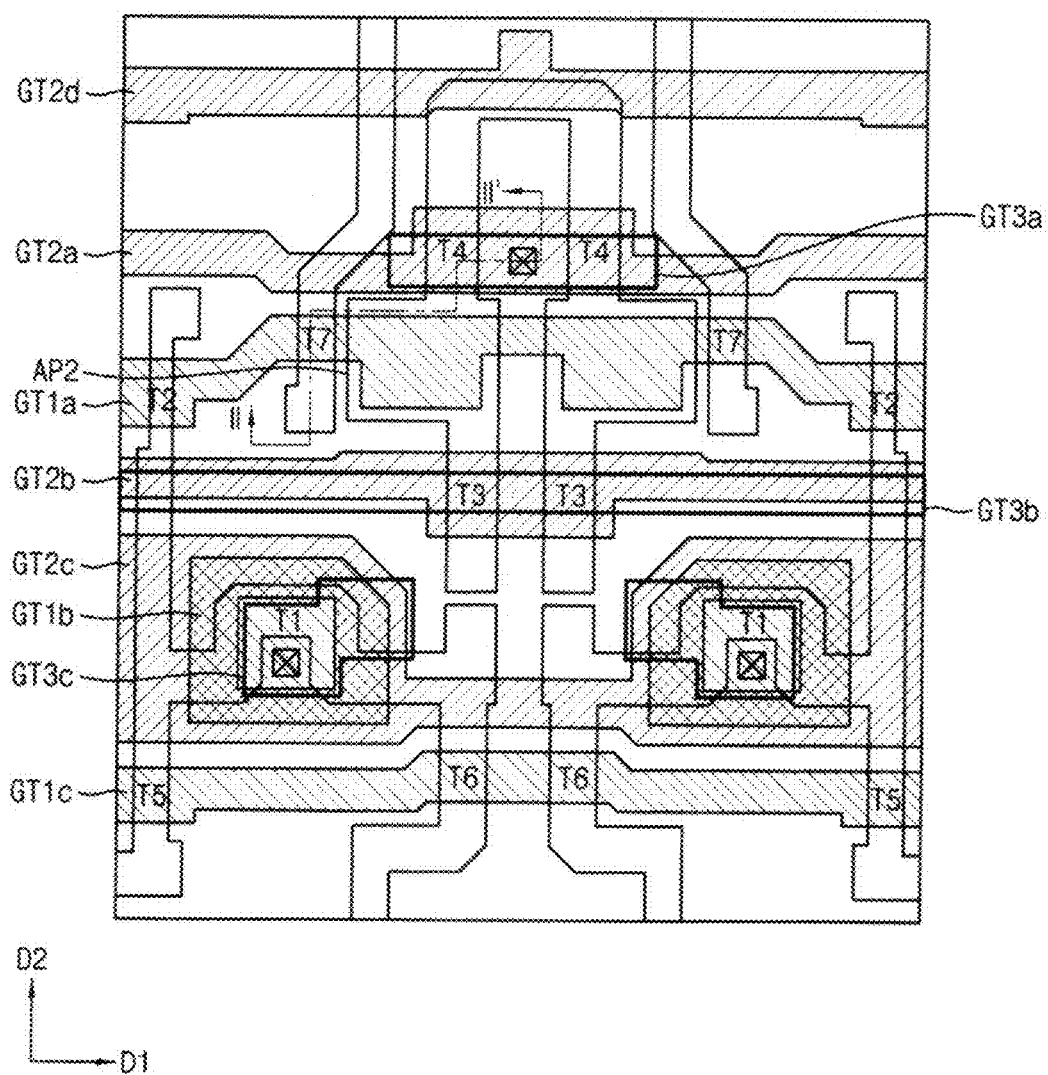
Figure 10:
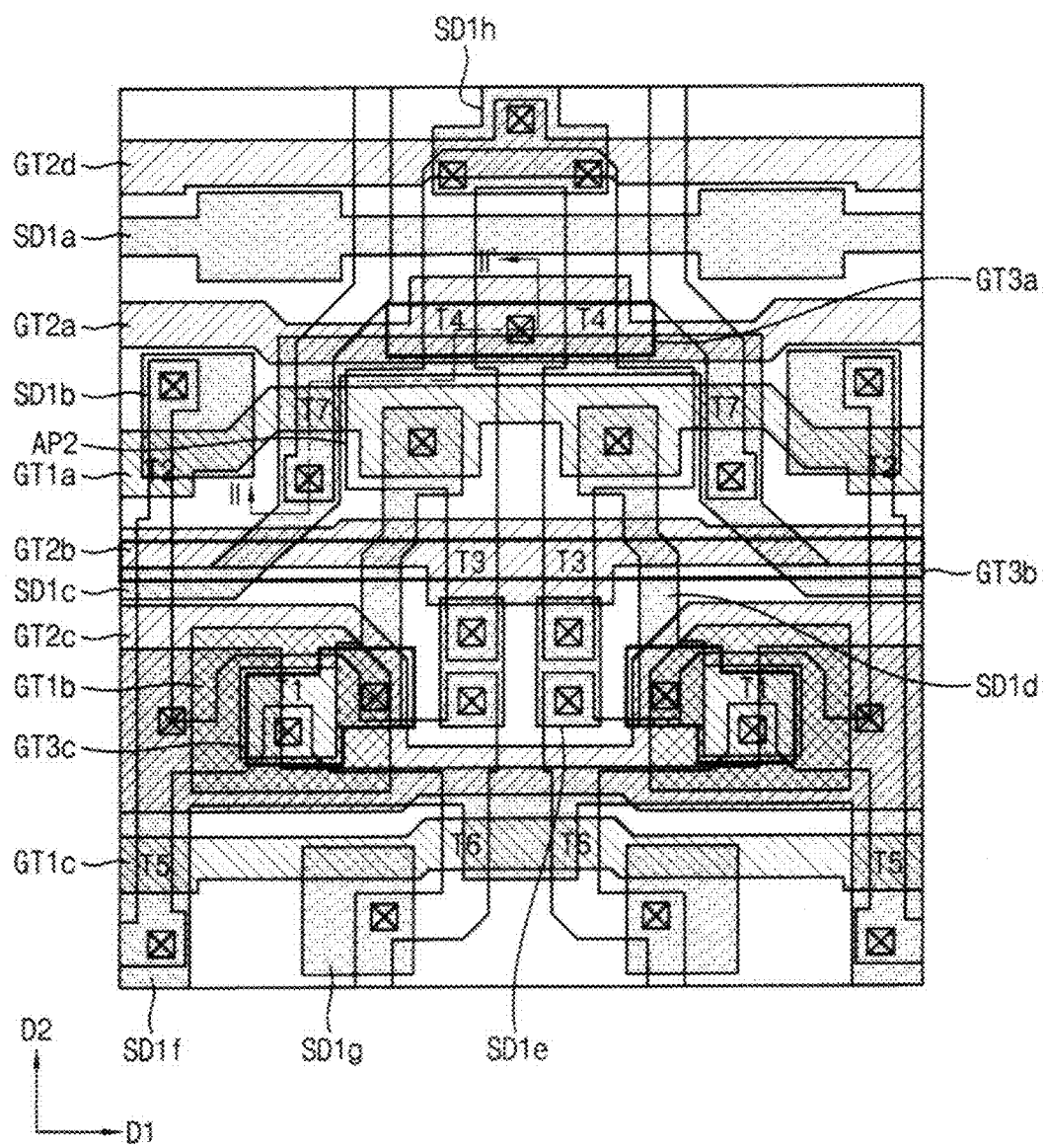
Figure 11:
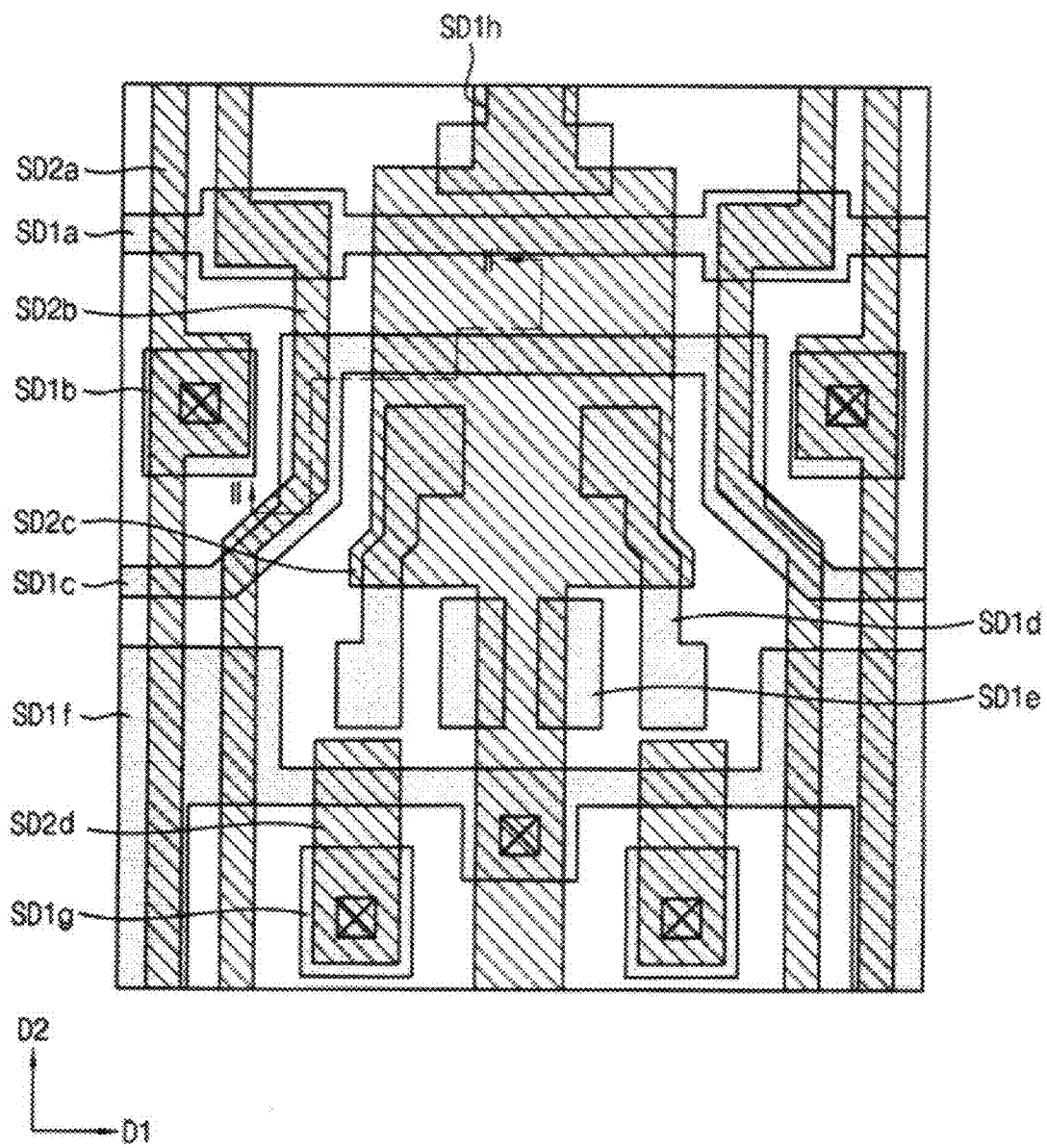

FIGS. 5, 6, 7, 8, 9, 10 and 11 are plan view illustrating a method for manufacturing a display device according to an embodiment. Particularly, FIGS. 5 to 11 are plan views showing a pixel area according to deposition steps. FIG. 11 shows a fourth conductive pattern and a fifth conductive pattern without first to third conductive patterns to prevent confusion due to excessive overlaying.

Figure 5:
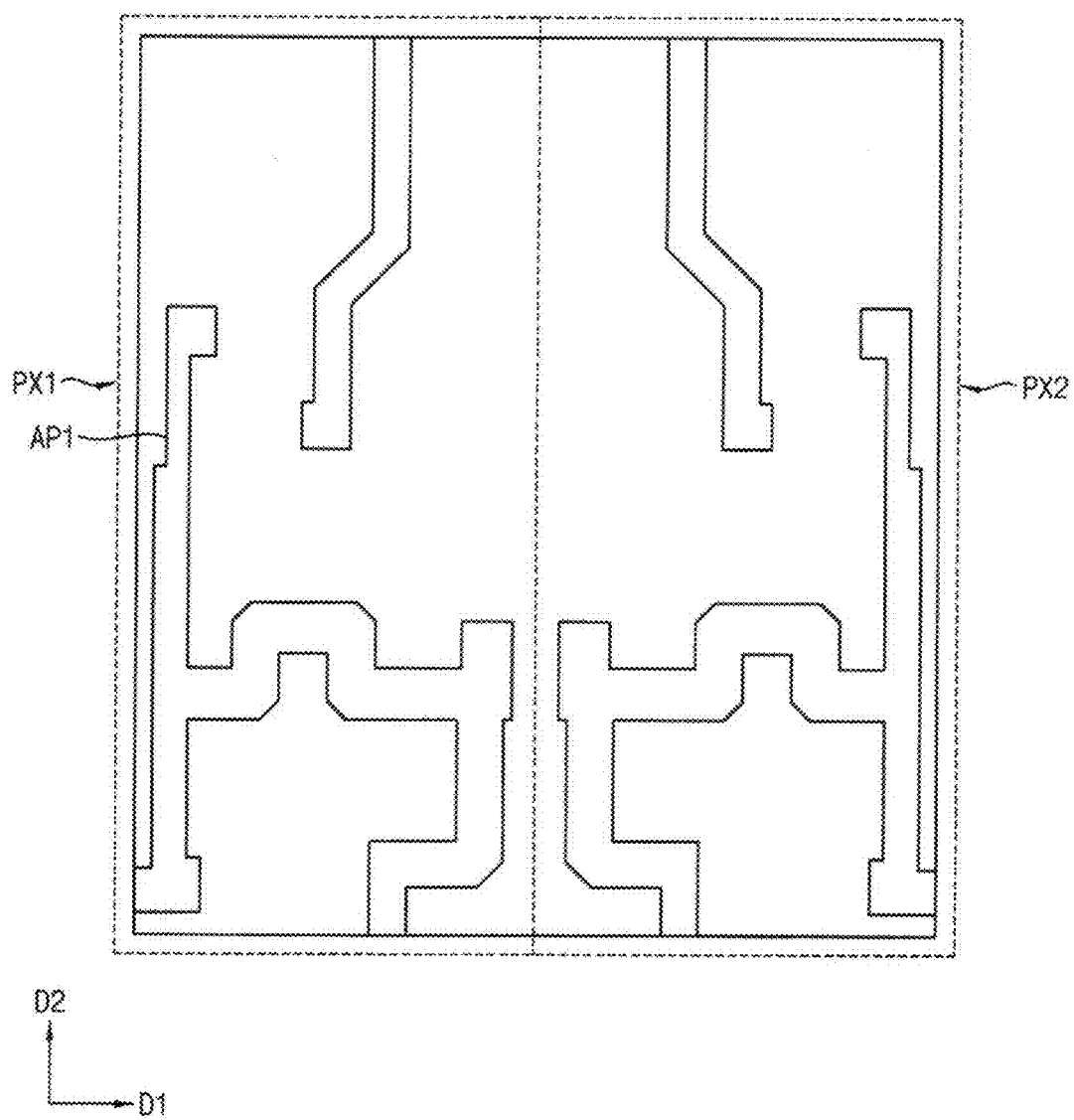
FIGS. 5, 6, 7, 8, 9, 10 and 11 are plan view illustrating a method for manufacturing a display device according to an embodiment.

FIGS. 5 to 11 may show a first pixel area PX1 and a second pixel area PX2, which are adjacent to each other along a first direction D1. In an embodiment, the first pixel area PX1 and the second pixel area PX2 may have a symmetrical shape with respect to a virtual line extending along a second direction D2 crossing the first direction D1 as shown in FIG. 5.

FIGS. 12, 13, 14, 15, 16, 17, 18, 19, 20, 21, 22, 23, 24, 25, 26, 27, 28, 29, 30, 31, 32 and 33 are cross-sectional views illustrating a method for manufacturing a display device according to an embodiment. Particularly, FIGS. 12, 13, 14, 16, 19, 20, 23, 25, 26, 28, 30 and 32 are cross-sectional views taken along line II-II' of FIGS. 6 to 11, and FIGS. 15, 17, 21, 24, 29, 31 and 33 are cross-sectional views taken along line I-I' of FIG. 2, and FIGS. 18, 22 and 27 are cross-sectional views showing a bending area.

Figure 12:
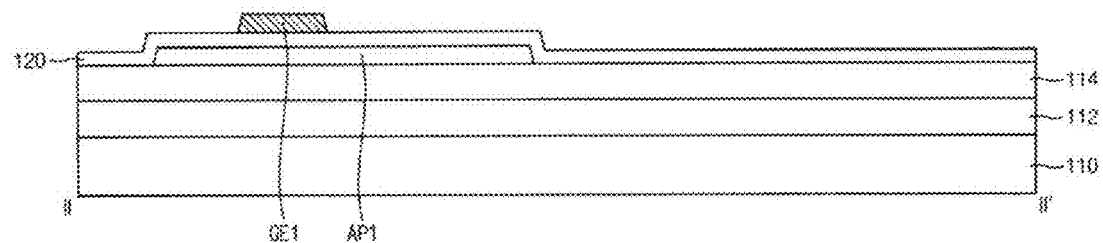
FIGS. 12, 13, 14, 15, 16, 17, 18, 19, 20, 21, 22, 23, 24, 25, 26, 27, 28, 29, 30, 31, 32 and 33 are cross-sectional views illustrating a method for manufacturing a display device according to an embodiment.

Referring to FIGS. 4, 5, and 12, a barrier layer 112 and a buffer layer 114 are disposed on a base substrate 110. A first active pattern AP1 is disposed on the buffer layer 114. A first insulation layer 120 is disposed on the first active pattern AP1.

The base substrate 110 may include at least one polymer film. The polymer film may include polyethylene terephthalate, polyethylene naphthalate, polyether ketone, polycarbonate, polyarylate, polyether sulfone, polyimide or a combination thereof. For example, the base substrate 110 may include at least two polymer films and an inorganic barrier layer disposed therebetween.

The barrier layer 112 and the buffer layer 114 may include an inorganic material. For example, the barrier layer 112 and the buffer layer 114 may each include silicon oxide, silicon nitride, silicon oxynitride or a combination thereof, and may have a single-layered structure or a multi-layered structure. In an embodiment, the barrier layer 112 may include silicon oxide, and the buffer layer 114 may have a stacked structure including a lower layer including silicon nitride and an upper layer including silicon oxide.

In an embodiment, the first active pattern AP1 may include silicon semiconductor. For example, the silicon semiconductor may include amorphous silicon, multi-crystalline silicon (polysilicon) or the like. For example, the first active pattern AP1 may include polysilicon crystallized from amorphous silicon.

In an embodiment, an ion may be implanted into the first active pattern AP1. For example, when the first, second, fifth, sixth and seventh transistors T1, T2, T5, T6 and T7 are designed to be PMOS transistors, p-type impurities such as boron or the like may be implanted into the first active pattern AP1.

The first insulation layer 120 may include an inorganic material, and may have a single-layered structure or a multiple-layered structure. For example, the first insulation layer 120 may include silicon oxide, silicon nitride, silicon oxynitride or a combination thereof. Furthermore, the first insulation layer 120 may include an insulating metal oxide such as aluminum oxide, tantalum oxide, hafnium oxide, zirconium oxide, titanium oxide or a combination thereof. In an embodiment, the first insulation layer 120 may include silicon oxide.

Figure 6:
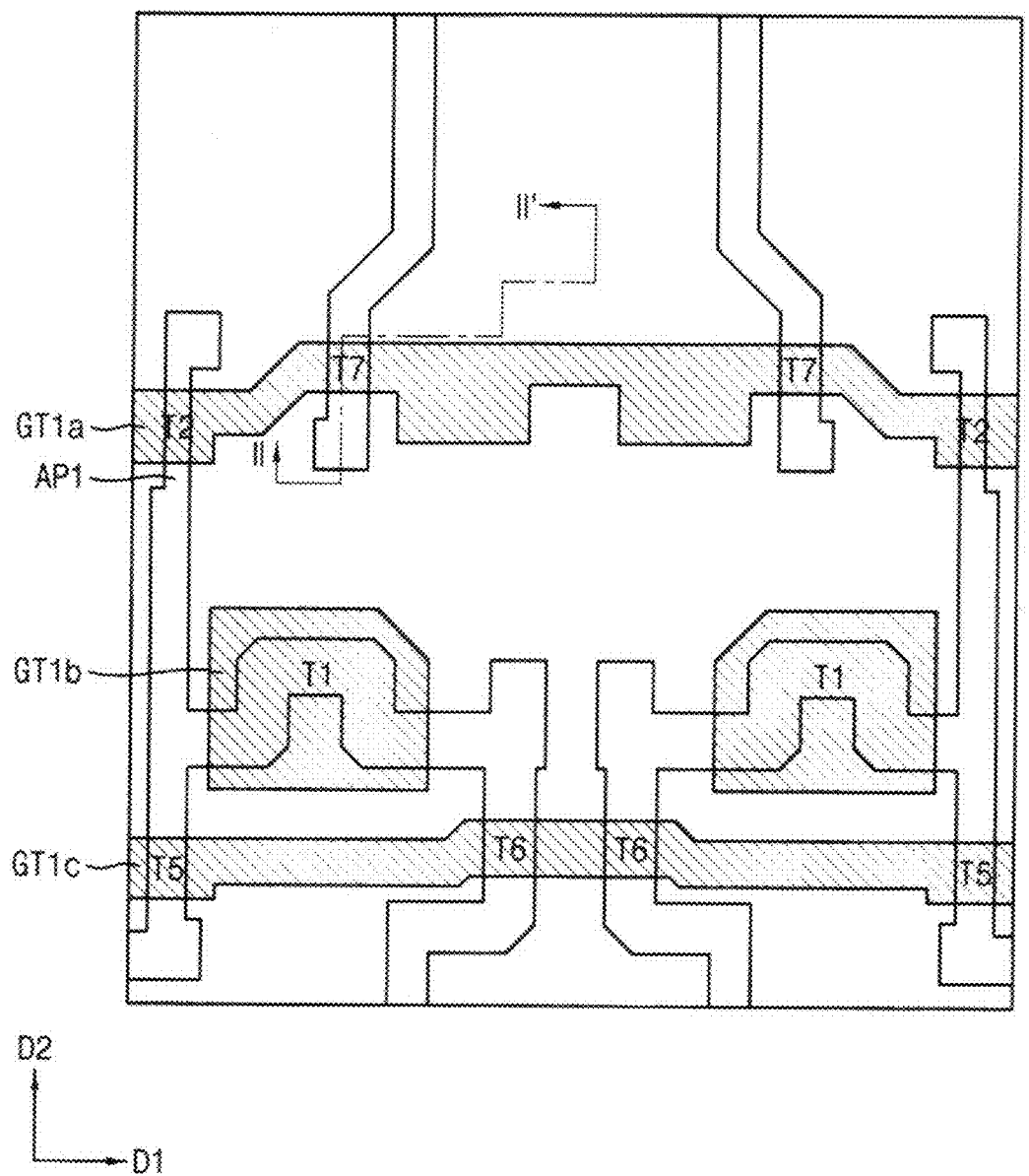

Referring to FIGS. 4, 6 and 12, a first conductive pattern is disposed on the first insulation layer 120. The first conductive pattern may be referred to as a first gate metal pattern. The first insulation layer 120 may be referred to as a first gate insulation layer.

In an embodiment, the first conductive pattern may include a first gate line GT1a, a first gate electrode pattern GT1b and a second gate line GT1c.

A portion of the first conductive pattern, which overlaps the first active pattern AP1, may function as a gate electrode, and may be referred to as a first gate electrode. For example, FIGS. 12, 13, 14, 16, 19, 20, 23, 25, 26, 28, 30 and 32 shows a gate electrode of the seventh transistor T7.

The first gate line GT1a may extend along a first direction D1. The first gate line GT1a with the first active pattern AP1 may constitute the second transistor T2. Furthermore, the first gate line GT1a with the first active pattern AP1 may constitute the seventh transistor T7.

In an embodiment, for example, the first gate signal GW and the fourth gate signal GB may be provided to the first gate line GT1a. The first gate signal GW and the fourth gate signal GB may be provided with a predetermined time difference and may have a substantially same wave form.

The first gate electrode pattern GT1b may have an island shape. The first gate electrode pattern GT1b with the first active pattern AP1 may constitute the first transistor T1.

The second gate line GT1c may extend along the first direction D1. The second gate line GT1c with the first active pattern AP1 may constitute the fifth and sixth transistors T5 and T6. For example, the emission control signal EM may be provided to the second gate line GT1c. The second gate line GT1c may be referred to as an emission control wiring.

Figure 7:
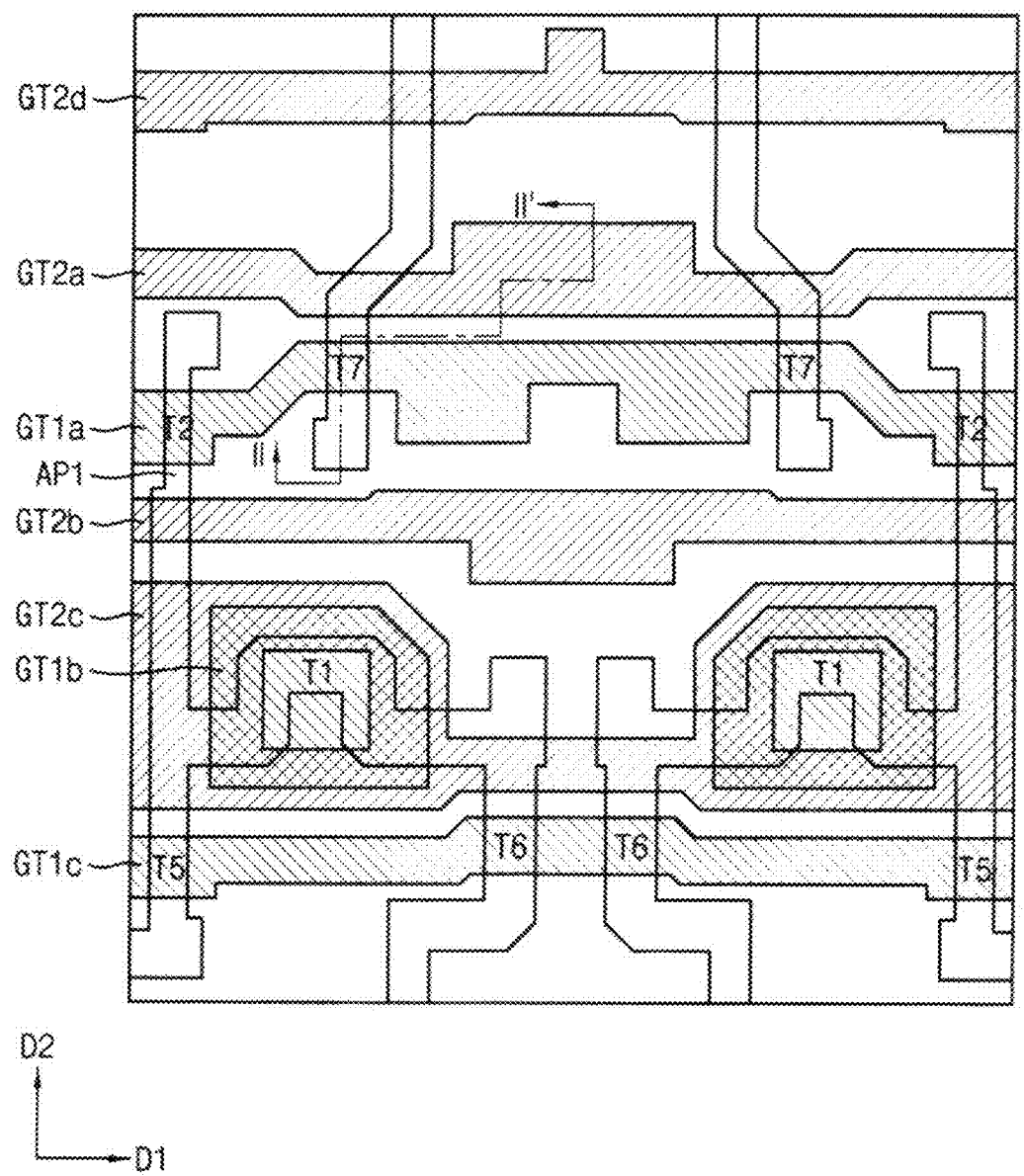
Figure 13:
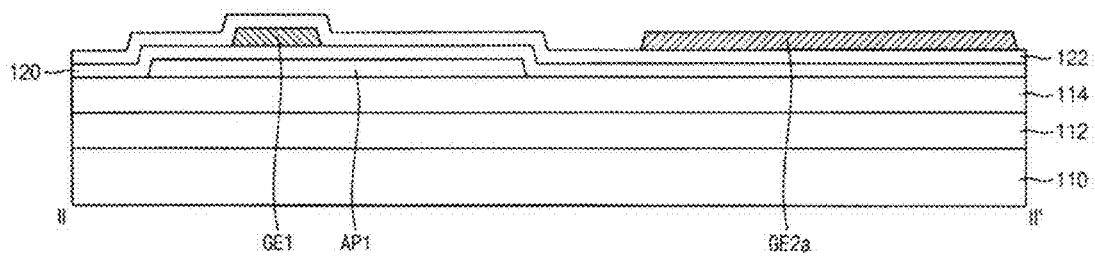

Referring to FIGS. 4, 7 and 13, a second insulation layer 122 is disposed to cover the first conductive pattern. A second conductive pattern is disposed on the second insulation layer 122. The second conductive pattern may be referred to as a second gate metal pattern. The second insulation layer 122 may be referred to as a second gate insulation layer.

In an embodiment, the second conductive pattern may include a third gate line GT2a, a fourth gate line GT2b, a storage capacitor electrode GT2c and a first initialization voltage wiring GT2d.

The third gate line GT2a may extend along the first direction D1. For example, the third gate line GT2a may be spaced apart from the first gate line GT1a along the second direction D2. The third gate signal GI may be provided to the third gate line GT2a. The third gate line GT2a may overlap a second active pattern in a plan view, which is disposed on the third gate line GT2a. A portion of the third gate line GT2a, which overlaps the second active pattern, may be referred to as a lower second gate electrode GE2a.

The fourth gate line GT2b may extend along the first direction D1. For example, the fourth gate line GT2b may be disposed between the first gate line GT1a and the second gate line GT1c, in a plan view. The second gate signal GC may be provided to the fourth gate line GT2b.

The storage capacitor electrode GT2c may overlap the first gate electrode pattern GT1b, and may extend along the first direction D1. For example, the storage capacitor electrode GT2c with the first gate electrode pattern GT1b may constitute the storage capacitor CST. The high power voltage ELVDD may be provided to the storage capacitor electrode GT2c. The storage capacitor electrode GT2c may define an opening, which overlaps the first gate electrode pattern GT1b.

The first initialization voltage wiring GT2d may extend along the first direction D1. In an embodiment, the initialization voltage VINT may be provided to the first initialization voltage wiring GT2d.

In an embodiment, for example, the first conductive pattern and the second conductive pattern may each include a metal, a metal alloy, a metal nitride, a conductive metal oxide or the like. For example, the first and second gate metal layers may each include gold (Au), silver (Ag), aluminum (Al), copper (Cu), nickel (Ni), platinum (Pt), magnesium (Mg), chromium (Cr), tungsten O), molybdenum (Mo), titanium (Ti), tantalum (Ta) or an alloy thereof, and may have a single-layered structure or a multi-layered structure including different metal layers. For example, at least one of the first conductive pattern and the second conductive pattern may have a single-layered structure or a multi-layered structure, which includes molybdenum.

Figure 8:
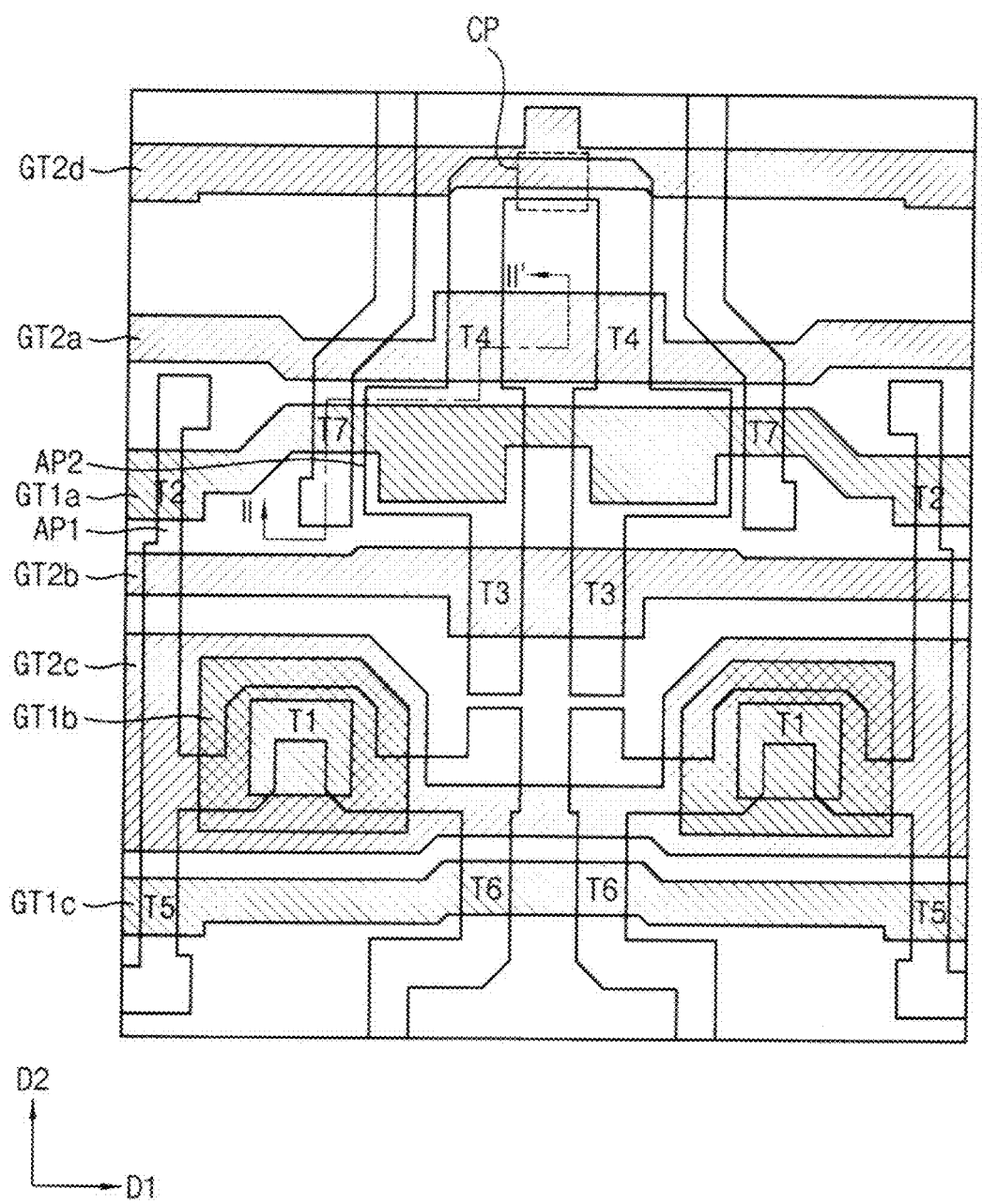
Figure 14:
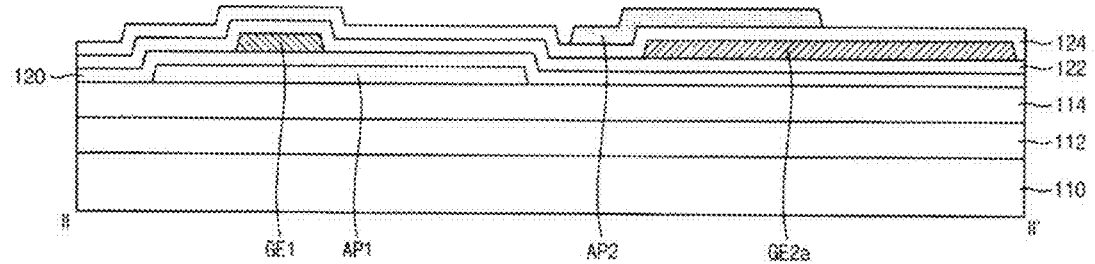

Referring to FIGS. 4, 8 and 14, a third insulation layer 124 is disposed to cover the second conductive pattern. A second active pattern AP2 is disposed on the third insulation layer 124. The third insulation layer 124 may be referred to as a first interlayer insulation layer.

In an embodiment, the second active pattern AP2 may include a metal oxide. For example, the second active pattern AP2 may include binary compound $(AB_x)$, ternary compound $(AB_xC_y)$ or quaternary compound $(AB_xC_yD_z)$, which contains indium (In), zinc (Zn), gallium (Ga), tin (Sn), titanium (Ti), aluminum (Al), hafnium (Hf), zirconium (Zr), magnesium (Mg). For example, the second active pattern AP2 may include zinc oxide $(ZnO_x)$, gallium oxide $(GaO_x)$, titanium oxide $(TiO_x)$, tin oxide $(SnO_x)$, indium oxide $(InO_x)$, indium-gallium oxide ("IGO"), indium-zinc oxide ("IZO"), indium tin oxide ("ITO"), gallium zinc oxide ("GZO"), zinc magnesium oxide ("ZMO"), zinc tin oxide ("ZTO"), zinc zirconium oxide $(ZnZr_xO_y)$, indium-gallium-zinc oxide ("IGZO"), indium-zinc-tin oxide ("IZTO"), indium-gallium-hafnium oxide ("IGHO"), tin-aluminum-zinc oxide ("TAZO"), indium-gallium-tin oxide ("IGTO"), or the like.

In an embodiment, the second active pattern AP2 may include indium-gallium-zinc oxide.

In an embodiment, the second active pattern AP2 may be spaced apart from the first active pattern AP1, in a plan view.

In an embodiment, the second active pattern AP2 may extend continuously in the first pixel area PX1 and the second pixel area PX2. For example, the second active pattern AP2 may have a symmetrical shape with respect to a virtual line extending along the second direction D2. For example, the second active pattern AP2 may include a first portion disposed in the first pixel area PX1, a second portion disposed in the second pixel area PX2 and a connection portion CP, which connects the first portion and the second portion to each other.

In an embodiment, the second active pattern AP2 may overlap the first gate line GT1a, the third gate line GT2a and the fourth gate line GT2b.

Figure 15:
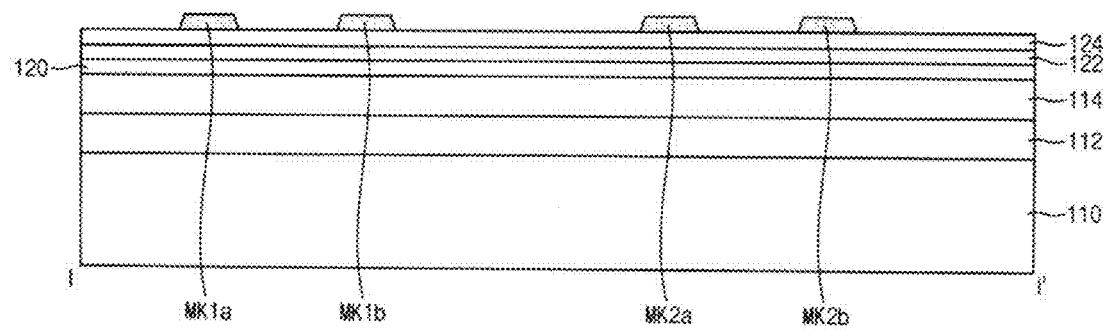

Referring to FIGS. 2 and 15, the barrier layer 112, the buffer layer 114, the first insulation layer 120, the second insulation layer 122 and the third insulation layer 124, which may extend from the display area DA, may be disposed on the base substrate 110 in a functional area NDA.

A mask pattern may be disposed on the third insulation layer 124. The mask pattern may be disposed with the second active pattern AP2. Thus, the mask pattern may include a metal oxide.

In an embodiment, the mask pattern may include a first mask pattern and a second mask pattern, which are spaced apart from each other. The first mask pattern may surround the second mask pattern, in a plan view.

The first mask pattern may include a first portion MK1a and a second portion MK1b, which are spaced apart from each other and each have a loop shape.

The second mask pattern may include a first portion MK2a and a second portion MK2b, which are spaced apart from each other and each have a loop shape.

Figure 16:
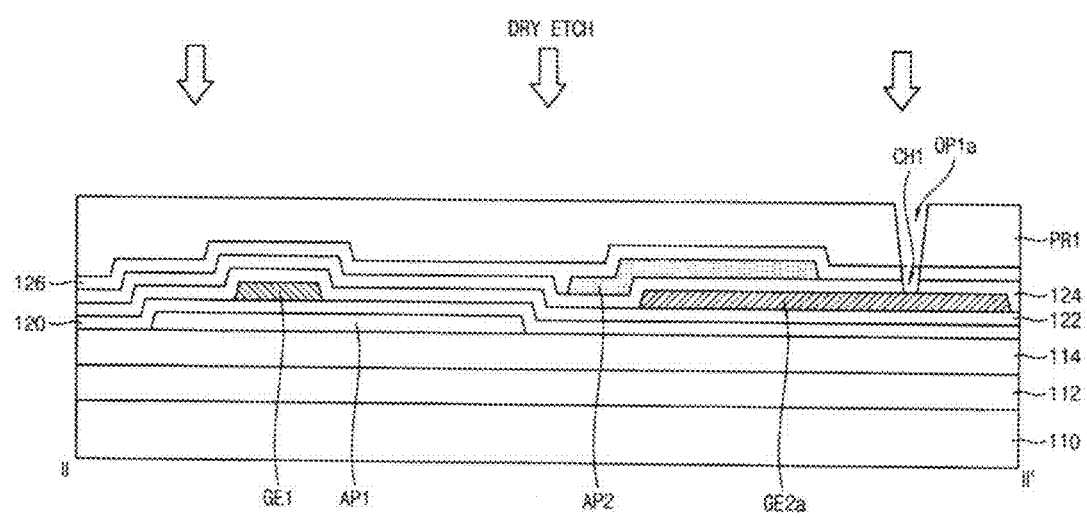
Figure 17:
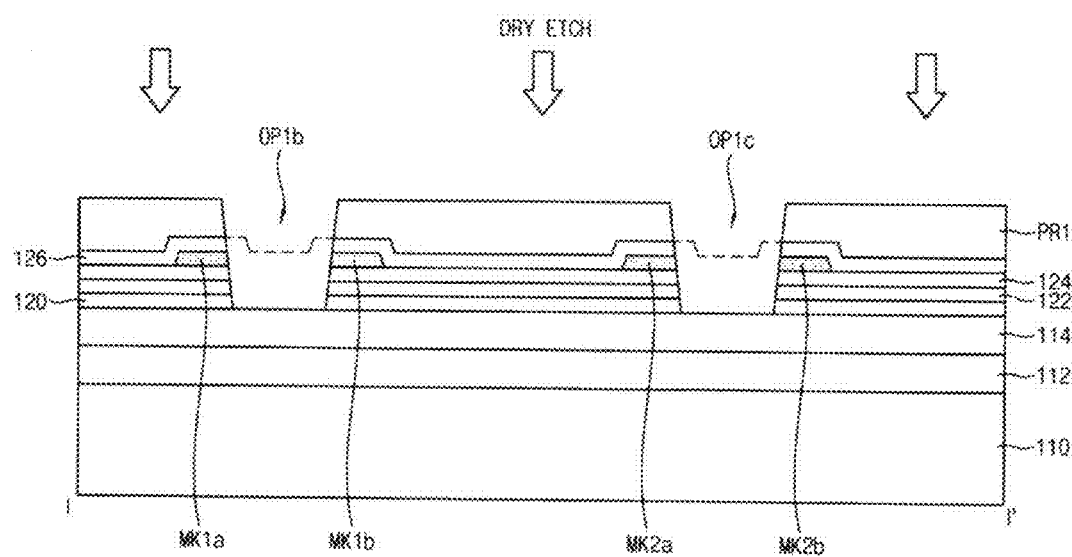
Figure 18:
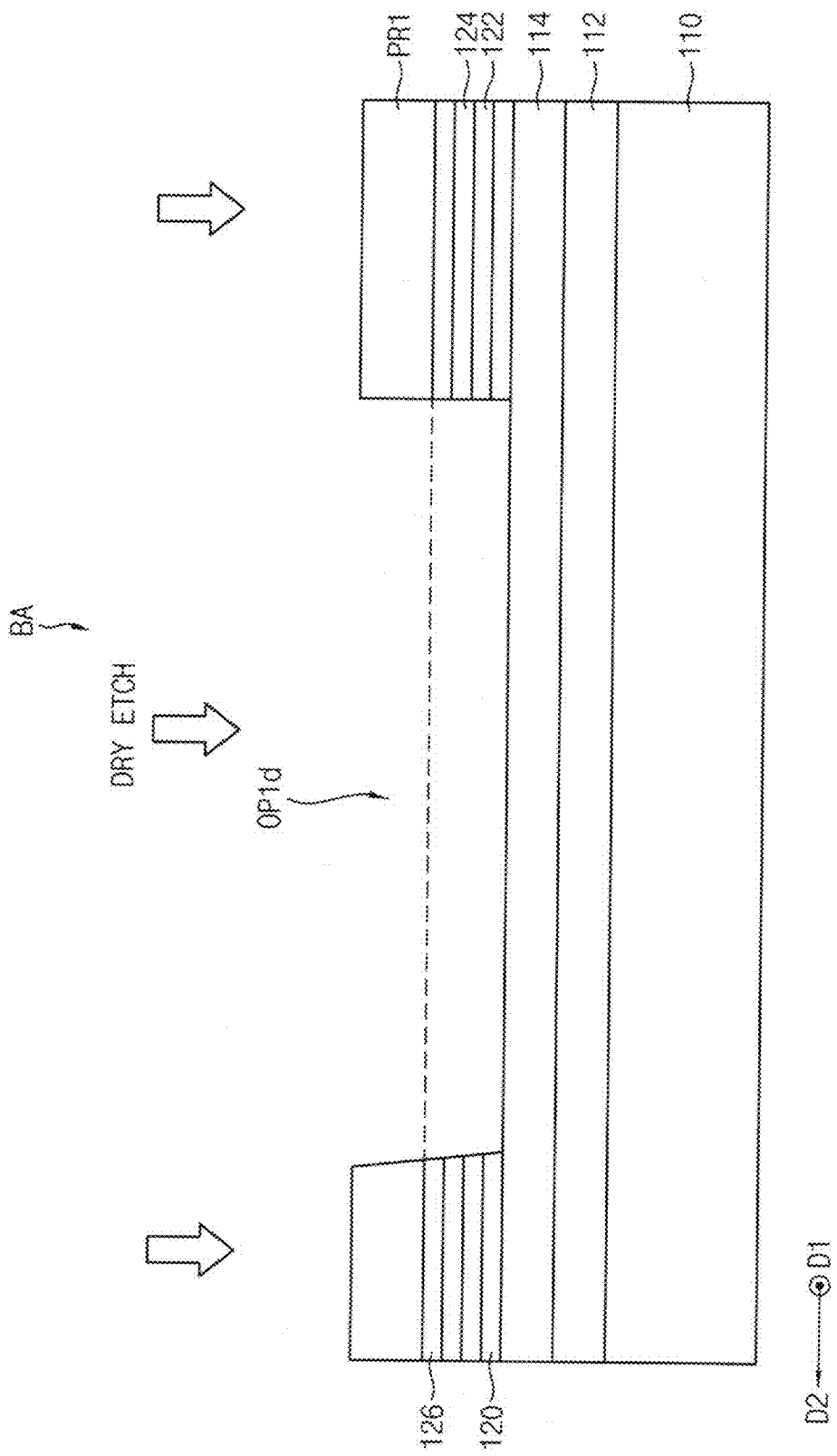

Referring to FIGS. 16 to 18, a fourth insulation layer 126 is disposed to cover the second active pattern AP2 and the mask pattern. The fourth insulation layer 126 may be referred to as a third gate insulation layer.

A first photoresist pattern PR1 including an opening is defined on the fourth insulation layer 126. Insulation layers under the opening of the first photoresist pattern PR1 are etched. In an embodiment, the insulation layers may be dry-etched. An etching process using the first photoresist pattern PR1 as a mask may be referred to as a first dry-etching process.

In an embodiment, the first insulation layer 120, the second insulation layer 122, the third insulation layer 124 and the fourth insulation layer 126 may each include an inorganic material, and may each have a single-layered structure or a multi-layered structure. For example, the first insulation layer 120, the second insulation layer 122, the third insulation layer 124 and the fourth insulation layer 126 may each include silicon oxide, silicon nitride, silicon oxynitride or a combination thereof, or may include an insulating metal oxide such as aluminum oxide, tantalum oxide, hafnium oxide, zirconium oxide, titanium oxide or a combination thereof.

In an embodiment, for example, the first insulation layer 120 may include silicon oxide, the second insulation layer 122 may include silicon nitride, the third insulation layer 124 may include a lower layer including silicon oxide and an upper layer including silicon nitride, and the fourth insulation layer 126 may include silicon oxide.

Referring to FIG. 16, the first photoresist pattern PR1 may define a first opening OP1a, which overlaps a lower second gate electrode GE2a of the third gate line.

The fourth insulation layer 126 and the third insulation layer 124 may be etched under the first opening OP1a to form a first contact hole CH1 exposing the lower second gate electrode GE2a.

Referring to FIG. 17, the first photoresist pattern PR1 may further define a second opening OP1b and a third opening OP1c. The second opening OP1b overlaps a gap between the first portion MK1a and the second portion MK1b of the first mask pattern. The third opening OP1c overlaps a gap between the first portion MK2a and the second portion MK2b of the second mask pattern.

The fourth insulation layer 126, the third insulation layer 124, the second insulation layer 122 and the first insulation layer 120 may be etched under the second opening OP1*b* and the third opening OP1*c*.

Referring to FIG. 18, the first photoresist pattern PR1 may further define a fourth opening OP1*d*, which overlaps a bending area BA.

The fourth insulation layer 126, the third insulation layer 124, the second insulation layer 122 and the first insulation layer 120 may be etched under the fourth opening OP1*d*.

In an etching process, an etching depth may be adjusted, for example, depending on an etching time. In an embodiment, the first dry-etching process may be performed to remove the fourth insulation layer 126, the third insulation layer 124, the second insulation layer 122 and the first insulation layer 120 under the second to fourth openings OP1*b*, OP1*c* and OP1*d*. The second conductive pattern including the lower second gate electrode GE2*a* may have an etching resistance larger than the inorganic layers. Thus, the first dry-etching process may be performed with different etching depths in the display area DA, the function area NDA and the bending area BA.

Referring to FIGS. 17 and 18, the fourth insulation layer 126, the third insulation layer 124, the second insulation layer 122 and the first insulation layer 120 may be removed under the second to fourth openings OP1*b*, OP1*c* and OP1*d* in the first dry-etching process. However, embodiments are not limited thereto. The inorganic layers removed in the first dry-etching process may be adjusted depending on thickness of the inorganic layers and an etching time. For example, at least a portion of the first insulation layer 120 may remain, or a portion of the buffer layer 114 may be further removed, under the second to fourth openings OP1*b*, OP1*c* and OP1*d*.

Figure 19:
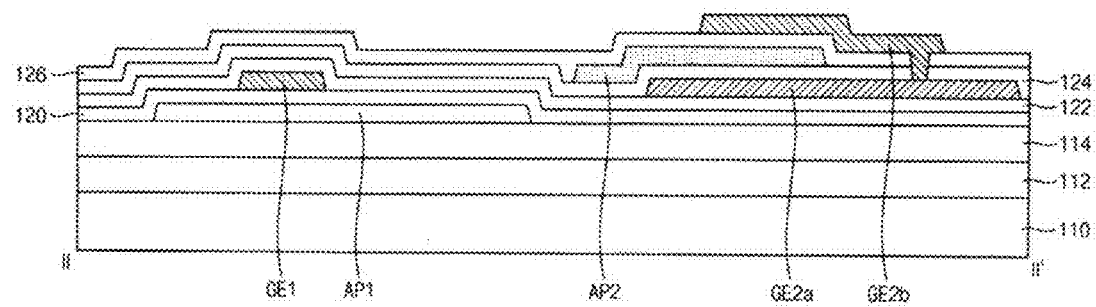

Referring to FIGS. 4, 9 and 19, a third conductive pattern is disposed on the fourth insulation layer 126.

In an embodiment, the third conductive pattern may include a second gate electrode pattern GT3*a*, a fifth gate line GT3*b* and a first connection pattern GT3*c*.

The second gate electrode pattern GT3*a* may overlap the third gate line GT2*a* and the second active pattern AP2. A portion of the second gate electrode pattern GT3*a*, which overlaps the second active pattern AP2, may be referred to as an upper second gate electrode GE2*b*.

The second gate electrode pattern GT3*a* including the upper second gate electrode GE2*b* may be electrically connected to the third gate line GT2*a* including the lower second gate electrode GE2*a*. In an embodiment, the second gate electrode pattern GT3*a* including the upper second gate electrode GE2*b* may electrically contact the third gate line GT2*a* including the lower second gate electrode GE2*a* through the first contact hole CH1. Thus, the third gate signal GI may be provided to the second gate electrode pattern GT3*a* including the upper second gate electrode GE2*b* through the third gate line GT2*a* including the lower second gate electrode GE2*a*.

Referring to FIG. 19, the lower second gate electrode GE2*a*, the second active pattern AP2 and the upper second gate electrode GE2*b* may constitute the fourth transistor T4. For example, the lower second gate electrode GE2*a* may correspond to the back-gate terminal of the fourth transistor T4 illustrated in FIG. 4. The upper second gate electrode GE2*b* may correspond to the gate terminal of the fourth transistor T4 illustrated in FIG. 4.

Referring to FIGS. 4 and 19, the fifth gate line GT3*b* may extend along the first direction D1. The fifth gate line GT3*b* may overlap the fourth gate line GT2*b* and the second active pattern AP2.

The second gate signal GC may be provided to the fifth gate line GT3*b*. The fourth gate line GT2*b*, the second active pattern AP2 and the fifth gate line GT3*b* may constitute the third transistor T3. For example, the fourth gate line GT2*b* may include the back-gate terminal of the third transistor T3 illustrated in FIG. 4. The fifth gate line GT3*b* may include the gate terminal of the fourth transistor T3 illustrated in FIG. 4.

The first connection pattern GT3*c* may contact the first gate electrode pattern GT1*b*. The first connection pattern GT3*c* may be electrically connected to a drain terminal of the fourth transistor T4 to transfer the initialization voltage VINT to the first gate electrode pattern GT1*b*.

In an embodiment, for example, the third conductive pattern may include a metal, a metal alloy, a metal nitride, a conductive metal oxide or the like. For example, the third conductive pattern may include the same material as the first conductive pattern or the second conductive pattern.

Figure 20:
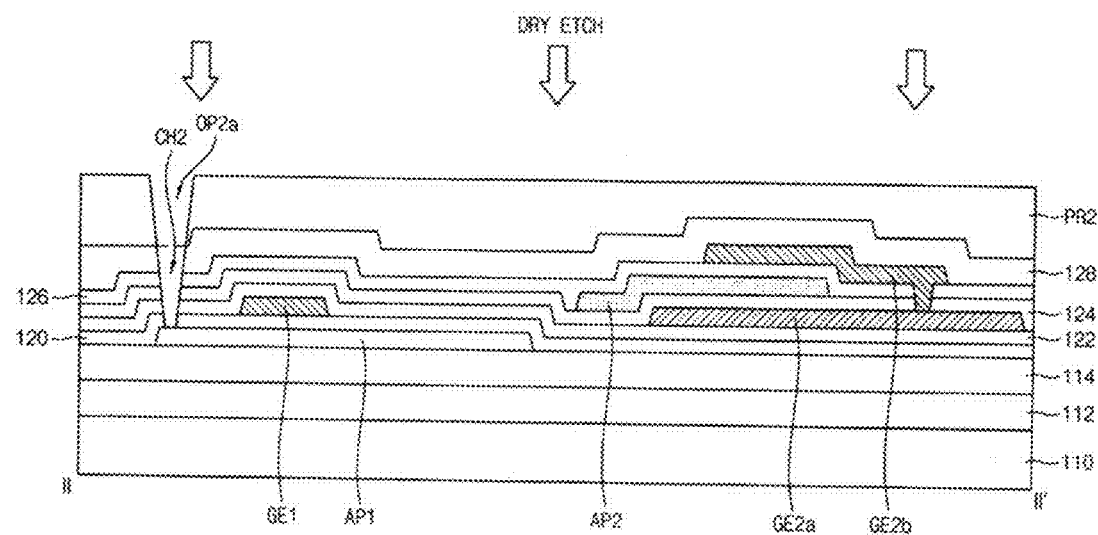
Figure 21:
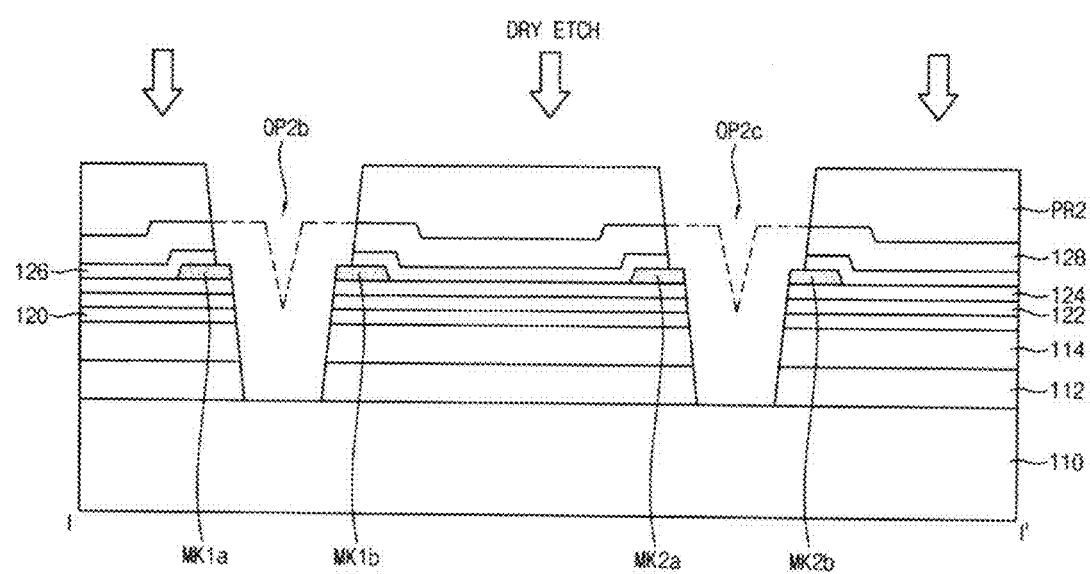
Figure 22:
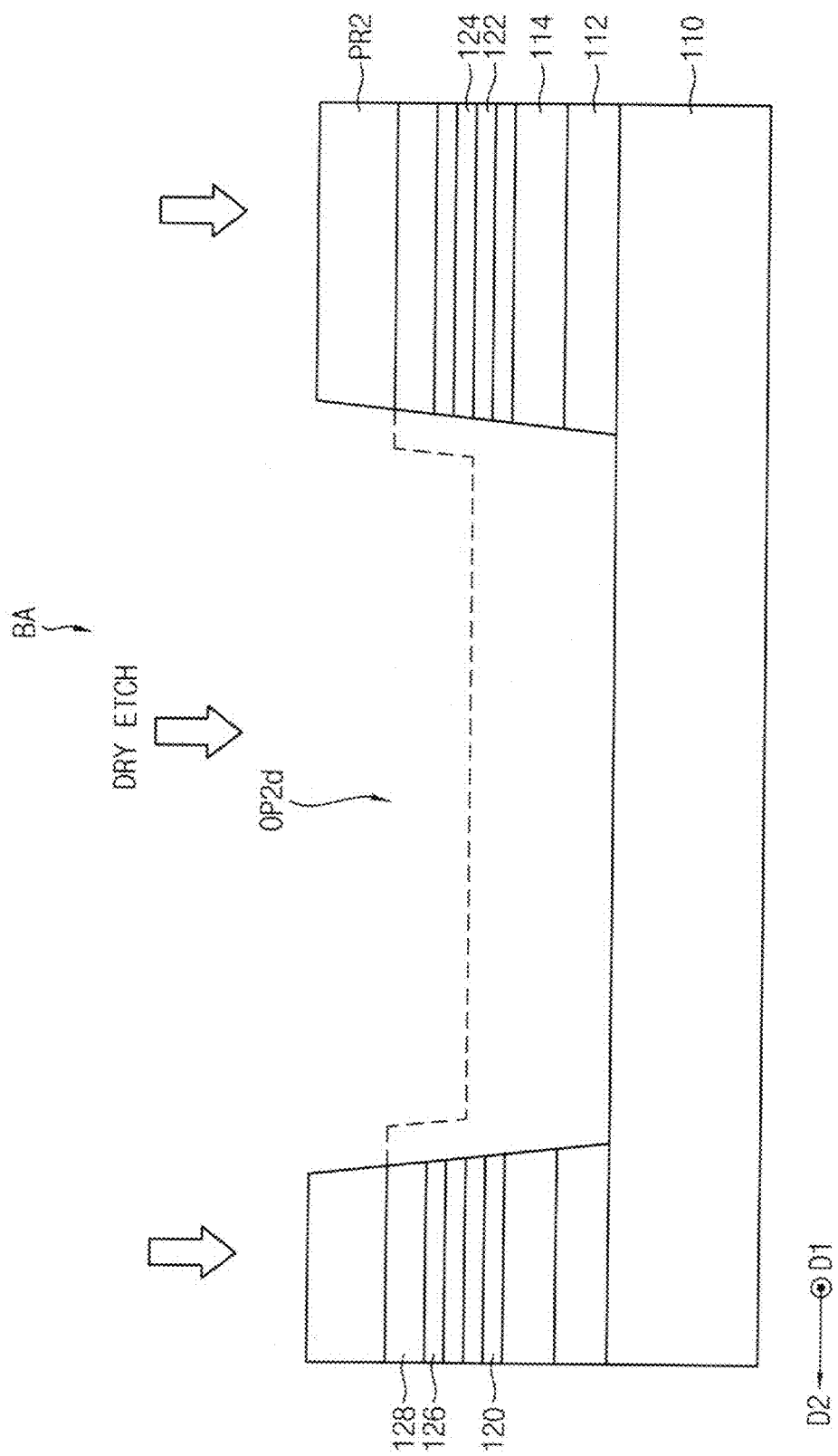

Referring to FIGS. 20 to 22, a fifth insulation layer 128 is disposed to cover the third conductive pattern. The fifth insulation layer 128 may be referred to as a second interlayer insulation layer.

A second photoresist pattern PR2 defining an opening is disposed on the fifth insulation layer 128. Insulation layers under the opening of the second photoresist pattern PR2 are etched. In an embodiment, the insulation layers may be dry-etched. An etching process using the second photoresist pattern PR2 as a mask may be referred to as a second dry-etching process.

In an embodiment, the fifth insulation layer 128 may include an inorganic material. For example, the fifth insulation layer 128 may include a lower layer including silicon oxide and an upper layer including silicon nitride.

Referring to FIG. 20, the second photoresist pattern PR2 may include a first opening OP2*a*, which overlaps the first active pattern AP1.

The fifth insulation layer 128, the fourth insulation layer 126, the third insulation layer 124, the second insulation layer 122 and the first insulation layer 120 may be etched under the first opening OP2*a* to form a second contact hole CH2 exposing the first active pattern AP1.

Referring to FIG. 21, the second photoresist pattern PR2 may further define a second opening OP2*b* and a third opening OP2*c*. The second opening OP2*b* overlaps a gap between the first portion MK1*a* and the second portion MK1*b* of the first mask pattern. The third opening OP2*c* overlaps a gap between the first portion MK2*a* and the second portion MK2*b* of the second mask pattern.

The fifth insulation layer 128, the buffer layer 114 and the barrier layer 112 may be etched under the second opening OP2*b* and the third opening OP2*c*. Accordingly, an upper surface of the base substrate 110 may be partially exposed in the functional area.

Referring to FIG. 22, the second photoresist pattern PR2 may further define a fourth opening OP2*d*, which overlaps a bending area BA.

The fifth insulation layer 128, the buffer layer 114 and the barrier layer 112 may be etched under the fourth opening OP2*d*. Accordingly, an upper surface of the base substrate 110 may be exposed in the bending area BA.

Accordingly, the inorganic layers may be entirely removed in the bending area BA.

Figure 23:
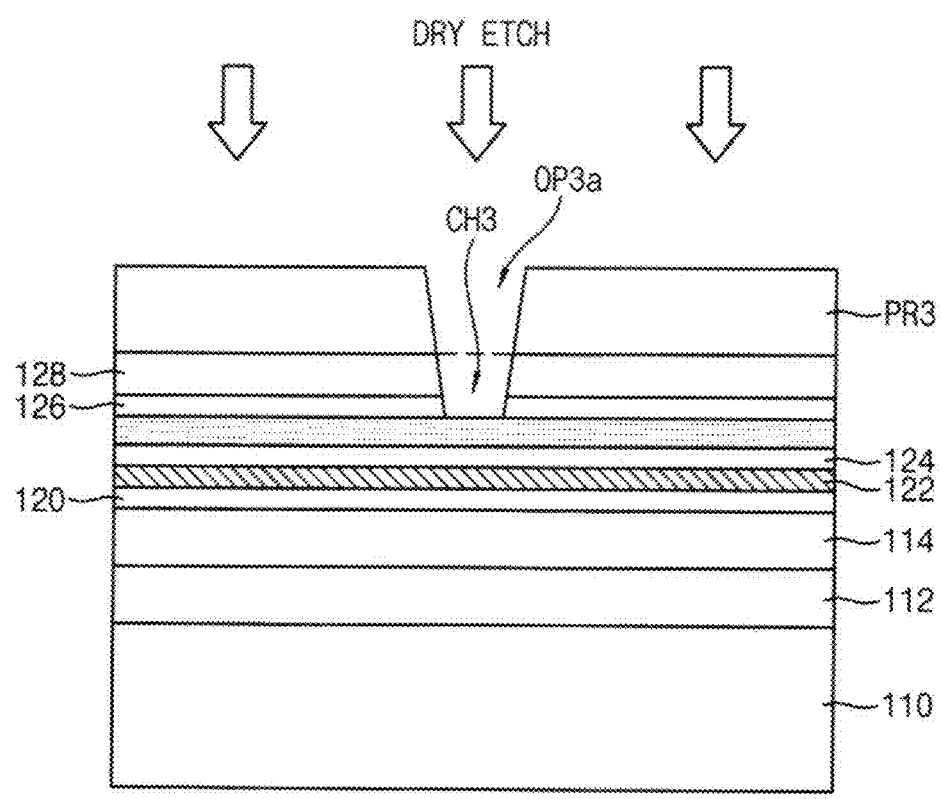

FIG. 23 is a cross-sectional view taken along line III-III' of FIG. 10.

Figure 24:
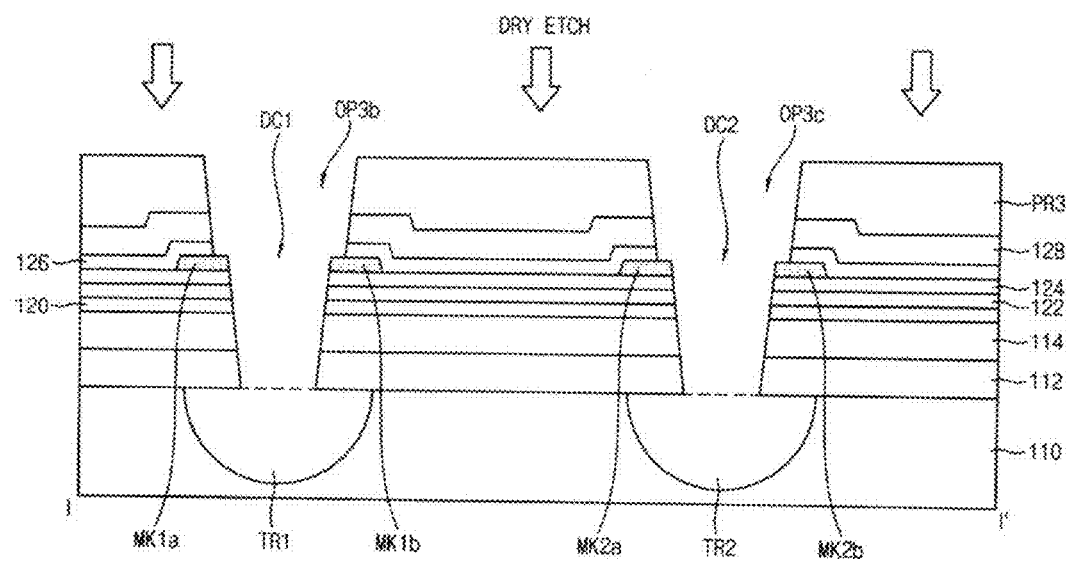

Referring to FIGS. 23 and 24, after the second photoresist pattern PR2 is removed, a third photoresist pattern PR3 defining an opening is disposed on the fifth insulation layer 128. Insulation layers under the opening of the third photoresist pattern PR3 are etched. In an embodiment, the insulation layers may be dry-etched. An etching process using the third photoresist pattern PR3 as a mask may be referred to as a third dry-etching process.

Referring to FIG. 23, the third photoresist pattern PR3 may define a first opening OP3a, which overlaps the second active pattern AP2.

The fifth insulation layer 128 and the fourth insulation layer 126 are etched under the first opening OP3a to form a third contact hole CH3 exposing the second active pattern AP2.

Referring to FIG. 24, the third photoresist pattern PR3 may further define a second opening OP3b and a third opening OP3c. The second opening OP3b overlaps a gap between the first portion MK1a and the second portion MK1b of the first mask pattern. The third opening OP3c overlaps a gap between the first portion MK2a and the second portion MK2b of the second mask pattern.

The base substrate 110 may be partially etched under the second opening OP3b and the third opening OP3c. Accordingly, a first trench TR1, which overlaps the first mask pattern, and a second trench TR2, which overlaps the second mask pattern, may be disposed at the base substrate 110. An area, in which the inorganic layers are removed on the first trench TR1, may define a first disconnection portion DC1. An area, in which the inorganic layers are removed on the second trench TR2, may define a second disconnection portion DC2.

In an embodiment, the base substrate 110 may include a polymeric material. Furthermore, the mask pattern may have a relatively larger etching resistance to an etching gas for etching the inorganic layers. Thus, the inorganic layers disposed under the mask pattern may not be etched. Accordingly, an etched area in the base substrate 110 may expand in a lateral direction. Thus, the trenches TR1 and TR2 may expose a lower surface of an inorganic layer, for example, a lower surface of the barrier layer 112 contacting the base substrate 110. Thus, the trenches TR1 and TR2 may form an undercut structure under the barrier layer 112.

Thus, the first trench TR1 may have a maximum width in the first direction D1 or the second direction D2 larger than a maximum width of the first disconnection portion DC1 in the same direction, and the second trench TR2 may have a maximum width in the first direction D1 or the second direction D2 larger than a maximum width of the second disconnection portion DC2 in the same direction.

Figure 25:
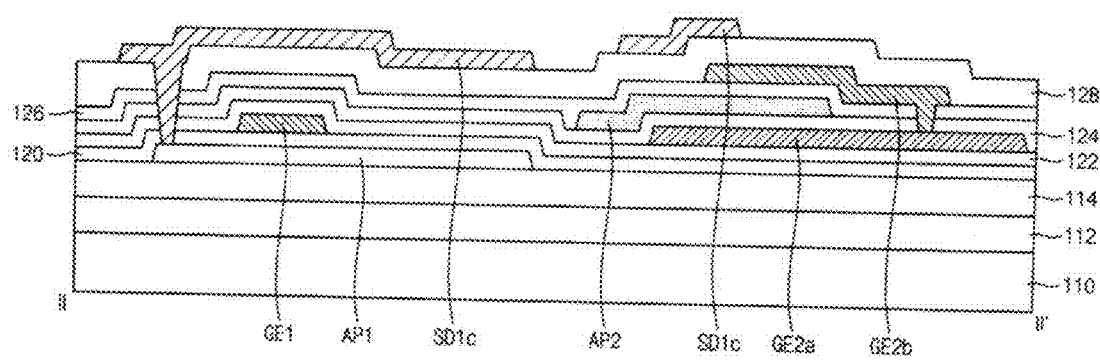

Referring to FIGS. 4, 10 and 25, a fourth conductive pattern is disposed on the fifth insulation layer 128.

In an embodiment, the fourth conductive pattern may include a horizontal transfer wiring SD1a, a second connection pattern SD1b, a second initialization voltage wiring SD1c, a third connection pattern SD1d, a fourth connection pattern SD1e, a fifth connection pattern SD1f, a sixth connection pattern SD1g and a seventh connection pattern SD1h.

The horizontal transfer wiring SD1a may extend along the first direction D1. The horizontal transfer wiring SD1a may correspond to the horizontal extending portion illustrated in FIG. 1, in the pixel area. Thus, a data voltage may be provided to the horizontal transfer wiring SD1a. The data voltage may be transferred to a data line, which is not illustrated FIG. 10. The horizontal transfer wiring SD1a may be a dummy wiring, which does not receive the data voltage, in another pixel area not illustrated in FIG. 10.

The second connection pattern SD1b may electrically contact the first active pattern AP1. The second connection pattern SD1b may electrically contact a data line, which is formed in a following step, to transfer a data voltage to the first active pattern AP1.

The second initialization voltage wiring SD1c may extend along the first direction D1. An anode initialization voltage AINT may be provided to the second initialization voltage wiring SD1c. The second initialization voltage wiring SD1c may electrically contact the first active pattern AP1 to transfer the anode initialization voltage AINT to the first active pattern AP1.

The third connection pattern SD1d may electrically contact the second active pattern AP2 and the first connection pattern GT3c. An initialization voltage VINT may be transferred to the first gate electrode pattern GT1b through the first initialization voltage wiring GT2d, the second active pattern AP2, the third connection pattern SD1d and the first connection pattern GT3c.

The fourth connection pattern SD1e may electrically contact the second active pattern AP2 and the first active pattern AP1. The fourth connection pattern SD1e may electrically connected to the second active pattern AP2 to the first active pattern AP1.

The fifth connection pattern SD1f may extend along the first direction D1. A high power voltage ELVDD may be provided to the fifth connection pattern SD1f. The fifth connection pattern SD1f may electrically contact the first active pattern AP1 to transfer the high power voltage ELVDD to the first active pattern AP1. Furthermore, the fifth connection pattern SD1f may electrically contact the storage capacitor electrode GT2c to transfer the high power voltage ELVDD to the storage capacitor electrode GT2c.

The sixth connection pattern SD1g may electrically contact the first active pattern AP1. The sixth connection pattern SD1g may transfer the driving current generated by the first transistor T1 or the anode initialization voltage AINT to the organic light-emitting diode OLED.

Figure 26:
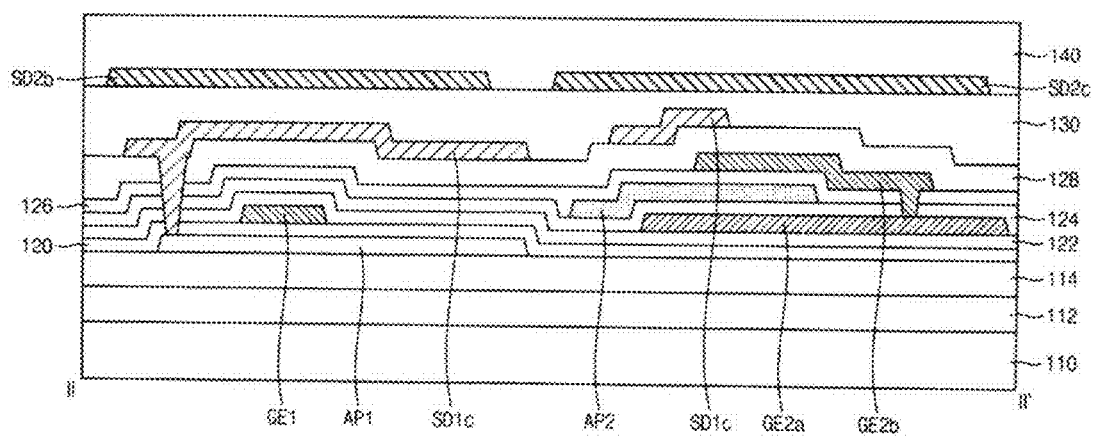

Referring to FIGS. 4, 11 and 26, a sixth insulation layer 130 is disposed to cover the forth conductive pattern. A fifth conductive pattern is disposed on the sixth insulation layer 130. A seventh insulation layer 140 is disposed to cover the firth conductive pattern. The sixth insulation layer 130 and the seventh insulation layer 140 may be referred to as a first via insulation layer and a second via insulation layer or as a first organic insulation layer and a second organic insulation layer.

In an embodiment, the sixth insulation layer 130 and the seventh insulation layer 140 may each include an organic insulation material. For example, sixth insulation layer 130 and the seventh insulation layer 140 may each include a phenolic resin, an acrylic resin, a polyimide resin, a polyamide resin, a siloxane resin, an epoxy resin or a combination thereof.

In an embodiment, the fifth conductive pattern may include a data line SD2a, a vertical transfer wiring SD2b, a power wiring SD2c and an eighth connection pattern SD2d.

The data line SD2a may extend along the second direction D2. A data voltage DATA may be transferred to the first active pattern AP1 through the data line SD2a and the second connection pattern SD1b.

The vertical transfer wiring SD2b may extend along the second direction D2. The vertical transfer wiring SD2b may correspond to the vertical extending portion illustrated in FIG. 1, in the pixel area. The vertical transfer wiring SD2b may electrically contact the horizontal transfer wiring SD1a in an area. For example, a first data voltage may be transferred to the first active pattern AP1 through the data line SD2a, and a second data voltage may be transferred to another data line, which is not illustrated in FIG. 11, through the vertical transfer wiring SD2*b* and the horizontal transfer wiring SD1*a*.

The vertical transfer wiring SD2*b* may be a dummy wiring, which does not receive the data voltage, or may not electrically contact the horizontal transfer wiring SD1*a*, in another pixel area not illustrated in FIG. 11.

In an embodiment, the vertical transfer wiring SD2*b* may overlap the first initialization voltage wiring GT2*d*, the second initialization voltage wiring SD1*c* and the fifth connection pattern SD1*f*. Thus, the first initialization voltage wiring GT2*d*, the second initialization voltage wiring SD1*c* and the fifth connection pattern SD1*f* may shield the vertical transfer wiring SD2*b*.

The eighth connection pattern SD2*d* may electrically contact the sixth connection pattern SD1*g*. The eighth connection pattern SD2*d* may transfer the driving current generated by the first transistor T1 or the anode initialization voltage AINT to the organic light-emitting diode OLED from the sixth connection pattern SD1*g*.

Figure 27:
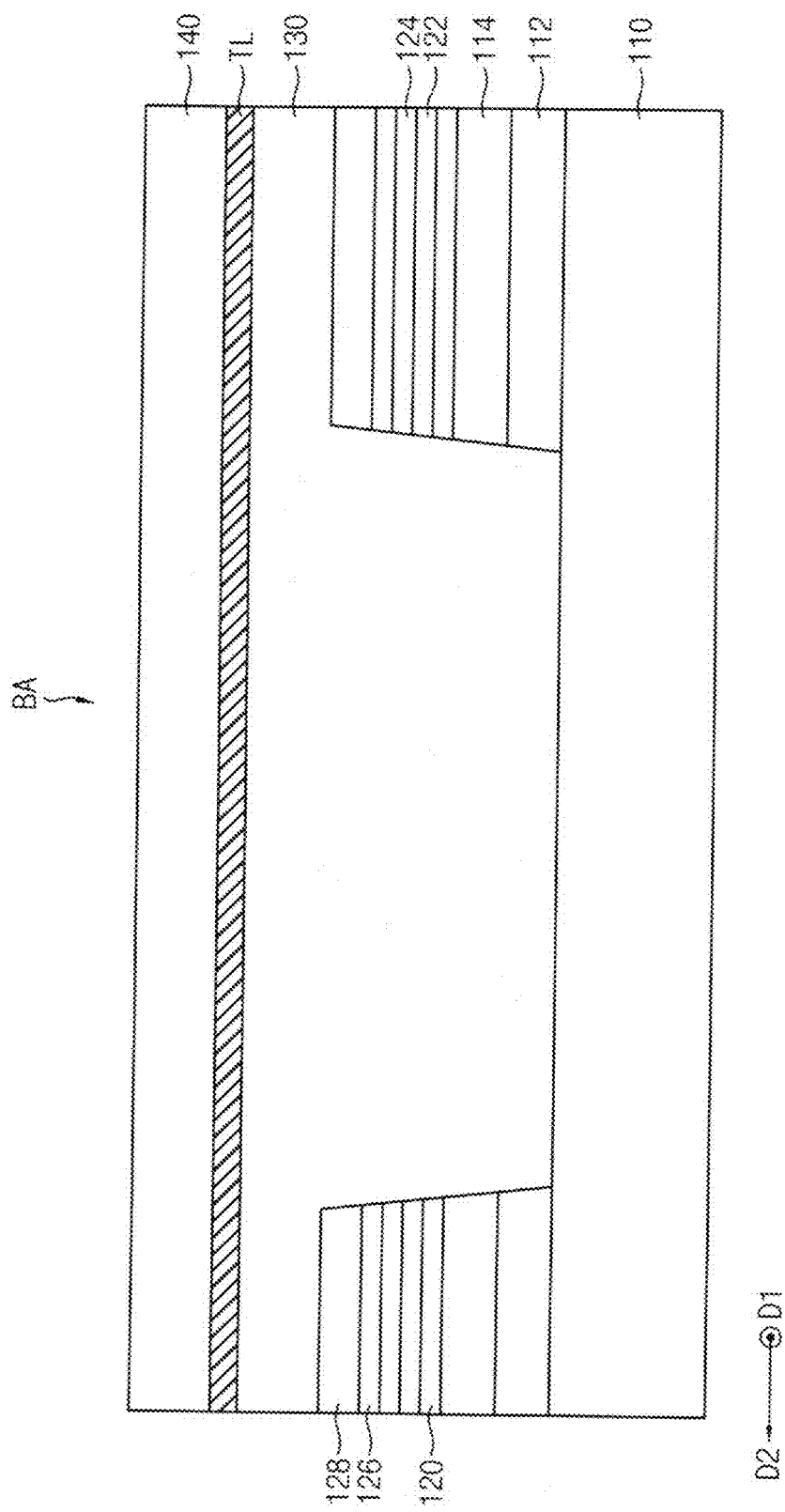

Referring to FIG. 27, the sixth insulation layer 130 may fill a space defined by removing inorganic layers and may planarize a substrate, in the bending area BA.

The fifth conductive pattern may further include a bending transfer wiring TL disposed in the bending area BA. The bending transfer wiring TL may be electrically connected to the transfer wirings disposed in the transfer area TA illustrated in FIG. 1.

The seventh insulation layer 140 may cover the bending transfer wiring TL in the bending area BA.

The fourth conductive pattern and the fifth conductive pattern may each include a metal, a metal alloy, a metal nitride, a conductive metal oxide or the like. For example, the fourth conductive pattern and the fifth conductive pattern may each include Au, Ag, Al, Cu, Ni, Pt, Mg, Cr, W, Mo, Ti, Ta or an alloy thereof, and may each have a single-layered structure or a multi-layered structure including different metal layers. In an embodiment, at least one of the fourth conductive pattern and the fifth conductive pattern may have a single-layered structure or a multi-layered structure, which includes aluminum.

Figure 28:
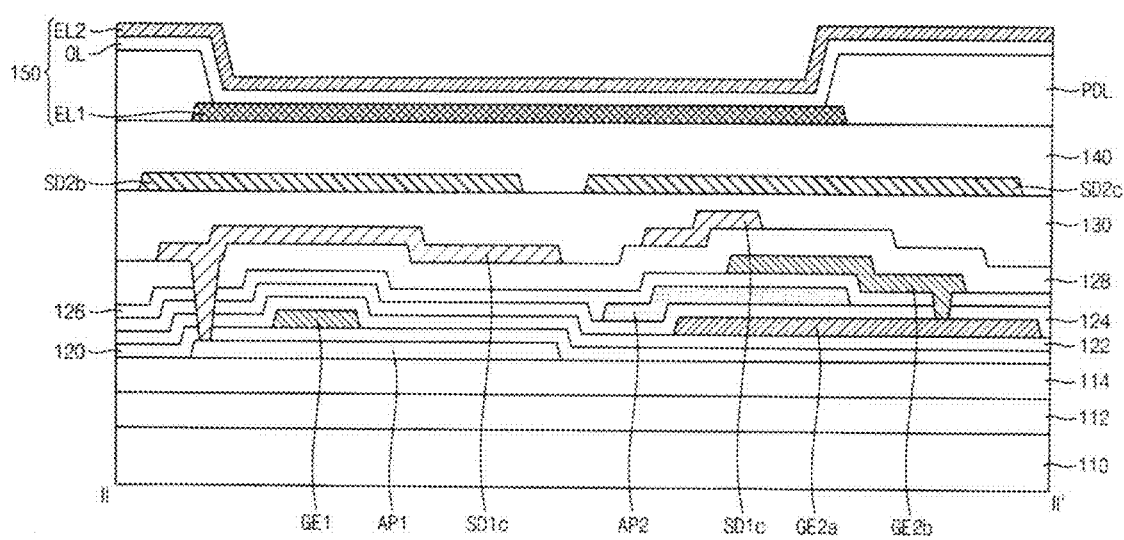

Referring to FIG. 28, a first electrode EL1 of an organic light-emitting diode 150 and a pixel-defining layer PDL may be disposed on the seventh insulation layer 140. In an embodiment, the first electrode EL1 may electrically contact the eighth connection pattern SD2*d* illustrated in FIG. 11. Furthermore, the first electrode EL1 may entirely or partially overlap at least one of the vertical transfer wiring SD2*b* and the power wiring SD2*c*. However, embodiments are not limited thereto. The first electrode EL1 may have various shapes and positions, as desired.

The first electrode EL1 may function as an anode. For example, the first electrode EL1 may be formed as a transmitting electrode or a reflecting electrode according to an emission type of the display device. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include Au, Ag, Al, Cu, Ni, Pt, Mg, Cr, W, Mo, Ti or a combination thereof, and may have a stacked structure further including the material that may be used for the transmitting electrode.

The pixel-defining layer PDL may define an opening that exposes at least a portion of the first electrode EL1. For example, the pixel-defining layer PDL may include an organic insulation material.

An organic light-emitting layer OL is disposed on the first electrode EL1. The organic light-emitting layer OL may include at least an emission layer, and may further include at least one of a hole injection layer ("HIL"), a hole transporting layer ("HTL"), an electron transporting layer ("ETL") and an electron injection layer ("EIL").

In an embodiment, the organic light-emitting layer OL may emit a red light, a green light or a blue light. In another embodiment, the organic light-emitting layer OL may emit a white light. The organic light-emitting layer OL emitting a white light may have a multi-layered structure including a red-emitting layer, a green-emitting layer and a blue-emitting layer, or a single-layer structure including a mixture of a red-emitting material, a green-emitting material and a blue-emitting material.

A second electrode EL2 is disposed on the organic light-emitting layer OL. In an embodiment, the second electrode EL2 may function as a cathode. For example, the second electrode EL2 may be formed as a transmitting electrode or a reflecting electrode according to an emission type of the display device. For example, when the second electrode EL2 may include a metal, a metal alloy, a metal nitride, a metal fluoride, a conductive metal oxide or a combination thereof.

In an embodiment, the organic light-emitting layer OL and the second electrode EL2 may be formed by deposition. For example, the organic light-emitting layer OL and the second electrode EL2 may be formed by a vacuum deposition method.

In an embodiment, the second electrode EL2 and at least a portion of the organic light-emitting layer OL may be disposed as a common layer, which is disposed entirely on a substrate. Thus, the organic light-emitting layer OL and the second electrode EL2 may extend into the functional area, as illustrated in FIG. 29.

Figure 29:
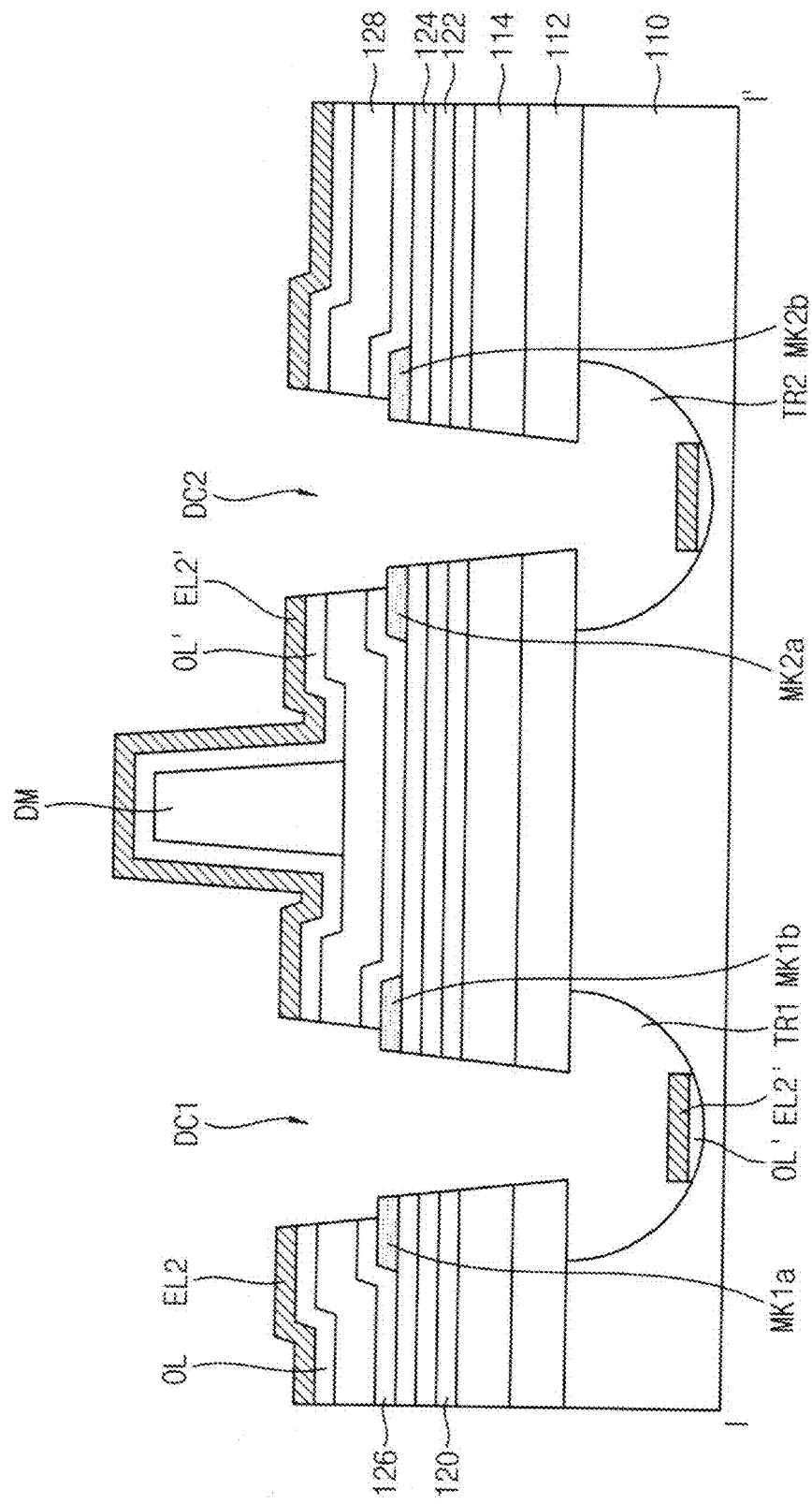

Referring to FIG. 29, a dam structure DM may be disposed in the functional area. The dam structure DM may be disposed between the first trench TR1 and the second trench TR2.

In an embodiment, the dam structure DM may have a shape surrounding the second trench TR2, in a plan view.

The dam structure DM may include an organic material. For example, the dam structure DM may include a pattern formed from the same layer as at least one of the sixth insulation layer 130, the seventh insulation layer 140 and the pixel-defining layer PDL. The dam structure DM may have a stacked structure including at least two layers or patterns to have a desired height.

A dummy layer OL' or EL2' formed from the same layer as at least a portion of the organic light-emitting layer OL and the second electrode EL2 may be disposed in the functional area.

In an embodiment, the emission layer of the organic light-emitting layer OL may include a light-emitting host and a dopant. The emission layer may be selectively disposed within an area, which overlaps the first electrode EL1. At least one of the functional layers, which may include the hole injection layer, the hole transporting layer, the electron transporting layer and the electron injection layer, may be formed as a common layer.

Thus, the organic light-emitting layer OL disposed in the display area DA may have a different material composition from an organic dummy layer OL' disposed in the functional area. For example, the organic light-emitting layer OL may include materials for the emission layer and the functional layers in an area overlapping the first electrode EL1, and the organic dummy layer OL' may include materials for the functional layers without materials for the emission layer.

In the functional area, the dummy layer OL' or EL2' may be disconnected by the disconnection portions DC1 and DC2. Even if the dummy layer OL' or EL2' extends vertically along the disconnection portions DC1 and DC2, the dummy layer OL' or EL2' may not be disposed on an inner side surface of the trenches TR1 and TR2 and on a lower surface of a barrier layer 112, which partially covers the trenches TR1 and TR2 because the common layer with the dummy layer OL' or EL2' is anisotropic-deposited in a vacuum deposition process. Thus, the dummy layer OL' or EL2' may be clearly disconnected by the trenches TR1 and TR2. A portion of the dummy layer OL' or EL2' may be disposed on a bottom surface of the trenches TR1 and TR2.

Figure 30:
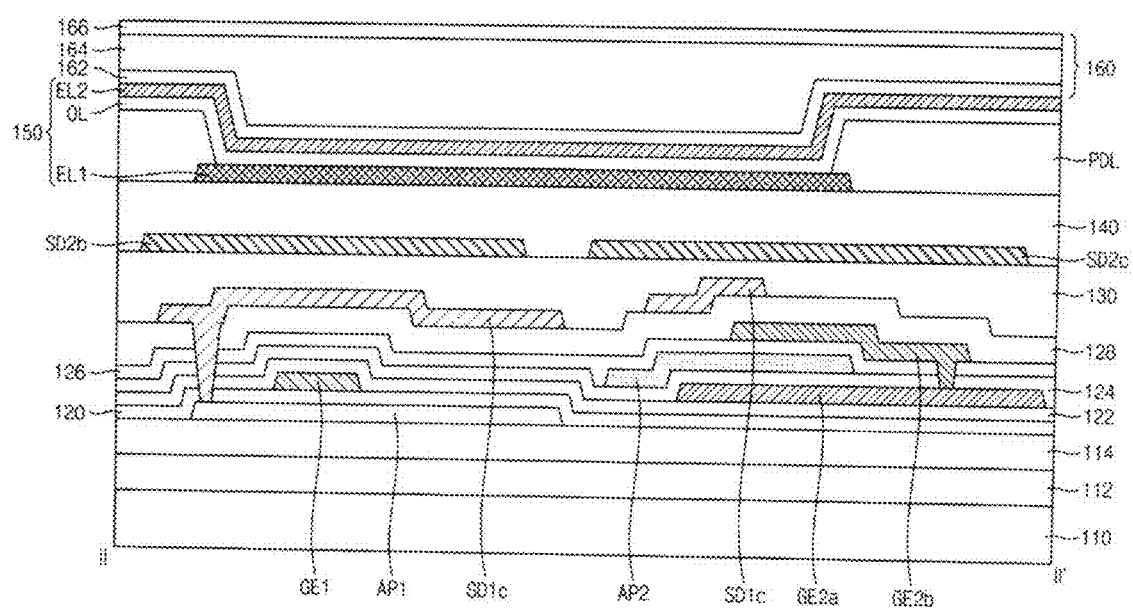
Figure 31:
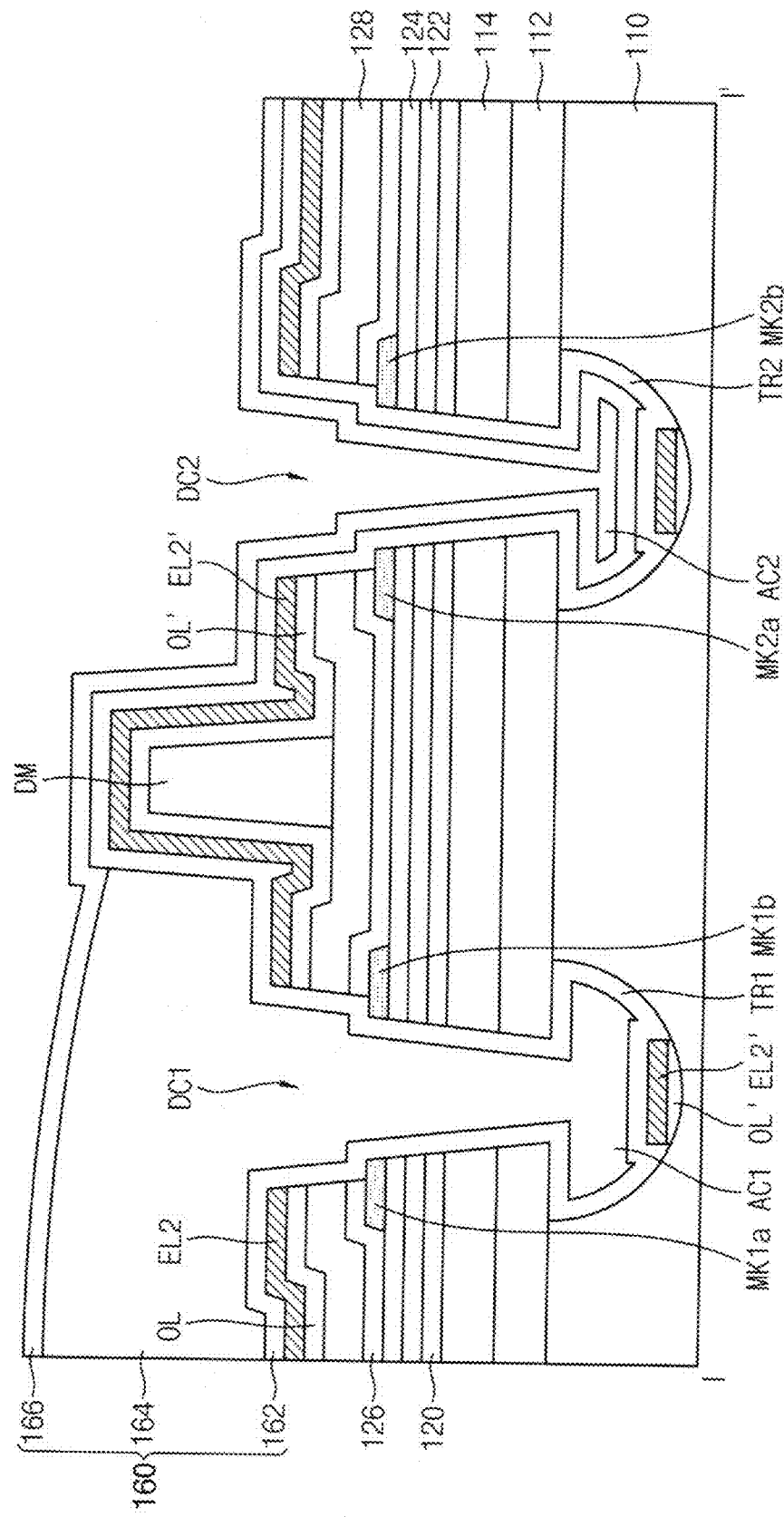

Referring to FIGS. 30 and 31, an encapsulation layer 160 may be disposed on the organic light-emitting diode 150.

In an embodiment, for example, the encapsulation layer 160 may have a stacked structure including an inorganic film and an organic film. In an embodiment, the encapsulation layer 160 may include a first inorganic film 162, an organic film 164 disposed on the first inorganic film 162 and a second inorganic film 166 disposed on the organic film 164.

In an embodiment, for example, the organic film 164 may include a cured polymer resin such as an acrylic resin, an epoxy resin or the like.

In an embodiment, for example, the inorganic films 162 and 166 may include silicon oxide, silicon nitride, silicon oxynitride, aluminum oxide, tantalum oxide, hafnium oxide, zirconium oxide, titanium oxide or a combination thereof.

Referring to FIG. 31, the encapsulation layer 160 may extend into the functional area.

In an embodiment, the first inorganic film 162 of the encapsulation layer 160 may extend along inner surfaces of the first trench TR1 and the second trench TR2. The second inorganic film 166 of the encapsulation layer 160 may extend along the inner surface of the second trench TR2.

A portion of the organic film 164 may be disposed in the first disconnection portion DC1 and the first trench TR1. The portion of the organic film 164, which is disposed in the first trench TR1, may be referred to as a first filling portion AC1. In an embodiment, a maximum width of the first filling portion AC1 in the first direction D1 or the second direction D2 may be larger than a maximum width of the first disconnection portion DC1 in the same direction. Thus, the first filling portion AC1 with a portion of the inorganic film 162, which is disposed in the first disconnection portion DC1, may form an anchor shape.

The dam structure DM may prevent a liquid composition from overflowing when the organic film 164 is disposed. In an embodiment, an outer boundary of the organic film 164 may be determined by position of the dam structure DM. Thus, the organic film 164 may not be disposed in the second trench TR2.

Figure 32:
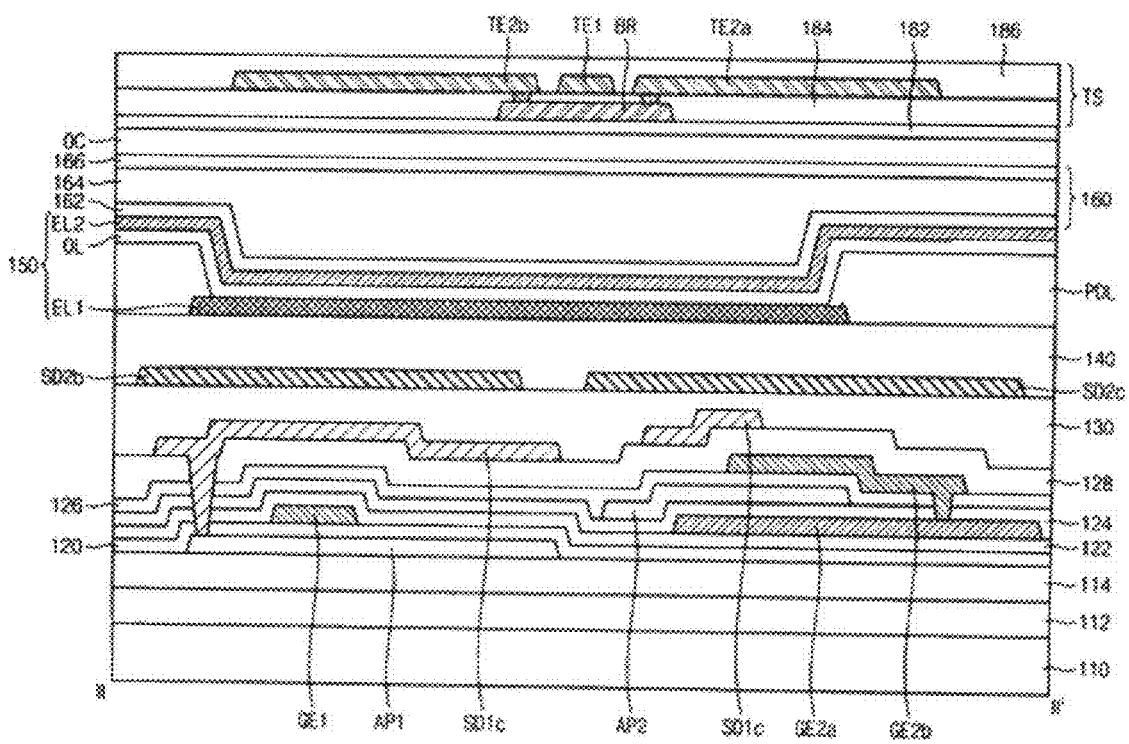
Figure 33:
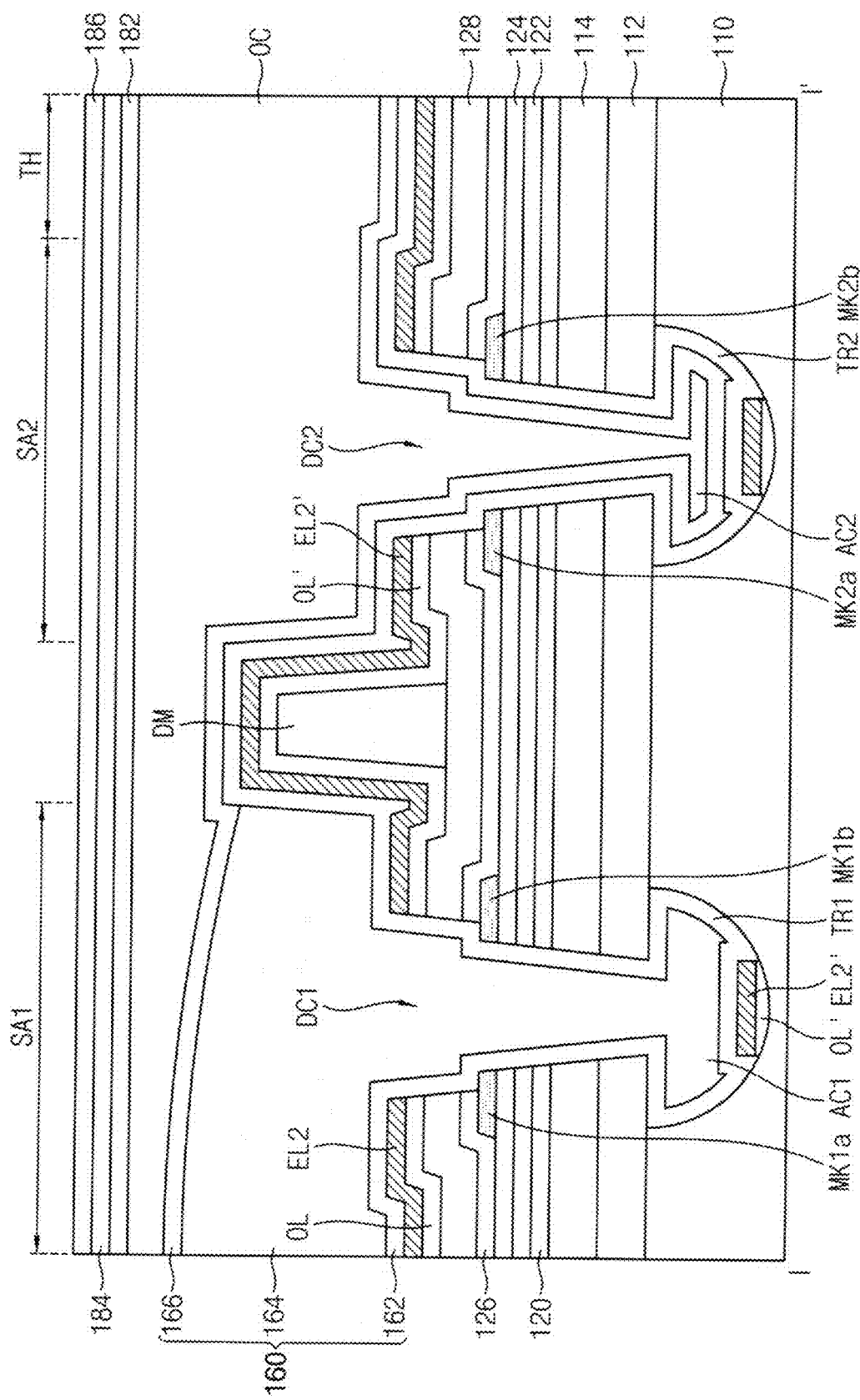

Referring to FIGS. 32 and 33, an overcoating layer OC may be disposed on the encapsulation layer 160. A lower passivation layer 182 may be disposed on the overcoating layer OC. A touch screen structure TS may be disposed on the lower passivation layer 182.

In an embodiment, the touch screen structure TS may include a first sensing electrode TE1 and a second sensing electrode, which extend to cross each other. The first sensing electrode TE1 and the second sensing electrode may be disposed in the same layer. For example, the first sensing electrode TE1 may have a continuously extending shape. The second sensing electrode may include a first electrode pattern TE2a and a second electrode pattern TE2b, which are spaced from each other. The first electrode pattern TE2a and the second electrode pattern TE2b may be electrically connected to each other through a bridge pattern BR.

In an embodiment, for example, the bridge pattern BR may be disposed on the lower passivation layer 182. A touch insulation layer 184 is disposed to cover the bridge pattern BR. The first sensing electrode TE1 and the second sensing electrode are disposed on the touch insulation layer 184. A touch protective layer 186 is disposed to cover the first sensing electrode TE1 and the second sensing electrode.

The lower passivation layer 182, the touch insulation layer 184 and the touch protective layer 186 may each include an inorganic material, an organic material or a combination thereof.

The overcoating layer OC may include an organic material. For example, the overcoating layer OC may include a phenolic resin, an acrylic resin, a polyimide resin, a polyamide resin, a siloxane resin, an epoxy resin or a combination thereof.

Referring to FIG. 33, the overcoating layer OC may extend into the functional area. The overcoating layer OC may planarize the functional area. The lower passivation layer 182, the touch insulation layer 184 and the touch protective layer 186 may extend from the display area DA to be disposed on the overcoating layer OC in the functional area.

In an embodiment, a portion of the overcoating layer OC may be disposed in the second disconnection portion DC2 and the second trench TR2. The portion of the overcoating layer OC, which is disposed in the second trench TR2, may be referred to as a second filling portion AC2. In an embodiment, a maximum width of the second filling portion AC2 in the first direction D1 or the second direction D2 may be larger than a maximum width of the second disconnection portion DC2 in the same direction. Thus, the second filling portion AC2 with a portion of the overcoating layer OC, which is disposed in the second disconnection portion DC2, may have an anchor shape.

In an embodiment, a gap between the first portion and the second portion of the mask patterns may be referred to as a slit. The organic film 164 of the encapsulation layer 160 and the overcoating layer OC may each pass through a slit of the first mask pattern and a slit of the second mask pattern to extend into the trenches TR1 and TR2, respectively.

According to the above, a display panel may be manufactured. The display panel may be combined with a polarization layer 200, as illustrated in FIG. 3. A portion of the display panel, which corresponds to the through-portion TH, may be removed after of before the display panel is combined with the polarization layer 200.

In an embodiment, an area, in which the first trench TR1 and the first mask pattern are disposed, between the dam structure DM and the display area DA may be referred to as a first blocking area SA1. An area, in which the second trench TR2 and the second mask pattern are disposed, between the dam structure DM and the through-portion TH may be referred to as a second blocking area SA2.

According to embodiments, when a display device including a metal oxide semiconductor and having a functional area disposed in a display area is manufactured, a mask pattern may be formed from a metal oxide layer in the functional area. A trench of a base substrate may be defined in the functional area in an etching process for forming a pixel structure in the display area. Thus, the trench may be formed without an additional photolithography process.

Embodiments may be applied to various display devices. For example, embodiment may be applied to vehicle-display device, a ship-display device, an aircraft-display device, portable communication devices, display devices for display or for information transfer, a medical-display device, etc.

The foregoing is illustrative of embodiments and is not to be construed as limiting thereof. Although embodiments have been described, those skilled in the art will readily appreciate that many modifications are possible in the embodiments without materially departing from the novel teachings and aspects of the present inventive concept. Accordingly, all such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. A display device comprising a display area and a functional area defining a through-portion therein, at least a portion of the functional area being surrounded by the display area, the display device comprising:
   an insulation layer disposed on a base substrate and defining a disconnection portion in the functional area, wherein the base substrate includes the through-portion which is connected from a lower surface of the base substrate to an upper surface of the base substrate;
   a pixel array disposed on the base substrate in the display area, the pixel array including a circuit part and a light-emitting element electrically connected to and disposed on the circuit part, the circuit part including a metal oxide active pattern, which includes a metal oxide and forms a channel of a transistor of the circuit part; and
   a mask pattern disposed in a same layer as the metal oxide active pattern and having a loop shape entirely surrounding the disconnection portion in a plan view.

2. The display device of claim 1, further comprising a functional module, wherein at least a portion of the functional module is disposed in the through-portion.

3. The display device of claim 2, wherein the function module includes at least one of a camera module, a face recognition sensor module, an iris recognition sensor module, an acceleration sensor module, a geomagnetism sensor module, a near sensor module, an infrared ray (IR) sensor module and an illumination sensor module.

4. The display device of claim 1, wherein the disconnection portion has a shape surrounding the through-portion in the plan view.

5. The display device of claim 1, wherein the base substrate defines a trench connected to the disconnection portion.

6. The display device of claim 5, wherein the insulation layer is disposed under the mask pattern.

7. The display device of claim 6, wherein the trench defines an undercut structure.

8. The display device of claim 1, further comprising:
   an encapsulation layer covering the pixel array and including at least an organic film; and
   a dam structure disposed in the functional area to control a boundary of the organic film.

9. The display device of claim 8, wherein the disconnection portion and the mask pattern are disposed between the dam structure and the display area.

10. The display device of claim 8, wherein a portion of the organic film is disposed in the disconnection portion.

11. The display device of claim 8, wherein the disconnection portion and the mask pattern are disposed between the dam structure and the through-portion.

12. The display device of claim 11, further comprising an overcoating layer disposed on the encapsulation layer and including an organic material,
    wherein a portion of the overcoating layer is disposed in the disconnection portion.

13. The display device of claim 1, wherein the mask pattern includes a first portion and a second portion, which are spaced apart from each other.

14. The display device of claim 1, wherein the circuit part further includes:
    a silicon active pattern including silicon;
    a first conductive pattern including a first gate electrode overlapping the silicon active pattern in the plan view;
    a second conductive pattern disposed under the metal oxide active pattern and including a lower second gate electrode which overlaps the metal oxide active pattern in the plan view; and
    a third conductive pattern disposed on the second active pattern and including an upper second gate electrode which overlaps the second active pattern in the plan view and is electrically connected to the lower second gate electrode.

15. The display device of claim 14, wherein the circuit part further includes:
    a fourth conductive pattern disposed on the third conductive pattern and including a horizontal transfer wiring which extends along a first direction; and
    a fifth conductive pattern disposed on the fourth conductive pattern and including a vertical transfer wiring,
    wherein the vertical transfer wiring extends along a second direction crossing the first direction and is electrically connected to the horizontal transfer wiring.

16. The display device of claim 15, wherein the fourth conductive pattern further includes a first data line extending along the second direction, wherein the horizontal transfer wiring is electrically connected to a second data line spaced apart from the first data line.

17. The display device of claim 1, wherein the light-emitting diode includes a first electrode, an organic light-emitting layer disposed on the first electrode and a second electrode disposed on the organic light-emitting layer,
    wherein a dummy layer including a same material as at least a portion of the organic light-emitting layer and the second electrode is disposed in the functional area,
    wherein the dummy layer is disconnected by the disconnection portion.

18. A display device comprising:
    a base substrate defining a through-portion therein, wherein the through-portion is connected from a lower surface of the base substrate to an upper surface of the base substrate;
    an insulation layer disposed on the base substrate and defining a disconnection portion, which surrounds the through-portion in a plan view;
    a pixel array disposed in a display area on the base substrate, the pixel array including a transistor and a light-emitting element electrically connected to the transistor; and
    a mask pattern spaced apart from the pixel array and having a loop shape entirely surrounding the disconnection portion in the plan view,
    wherein the insulation layer includes a first insulation layer disposed between the base substrate and the transistor, and a second insulation layer disposed between the transistor and the light-emitting element, and wherein the mask pattern is disposed between the first insulation layer and the second insulation layer in a vertical direction perpendicular to an upper surface of the base substrate, and has a side surface continuously connected to a side surface of a layer disposed directly under the mask pattern.

19. The display device of claim 18, further comprising a functional module, wherein at least a portion of the functional module is disposed in the through-portion.

20. The display device of claim 18, further comprising an encapsulation layer covering the pixel array and including at least an organic film.

21. The display device of claim 20, wherein a portion of the organic film is disposed in the disconnection portion.

22. The display device of claim 20, further comprising an overcoating layer disposed on the encapsulation layer and including an organic material,
wherein a portion of the overcoating layer is disposed in the disconnection portion.

23. The display device of claim 20, wherein the mask pattern includes a first portion and a second portion, which are spaced apart from each other,
wherein the organic film passes through a gap between the first portion and the second portion to extend in the disconnection portion.

24. The display device of claim 18, wherein the pixel array includes:
a first active pattern including silicon; and
a second active pattern,
wherein the second active pattern and the mask pattern include a same metal oxide and are disposed in a same layer.

25. A display device comprising a display area and a functional area defining a through-portion therein, at least a portion of the functional area being surrounded by the display area, the display device comprising:
a pixel array disposed on a base substrate in the display area and including an active pattern wherein the active pattern includes a metal oxide; and
a metal oxide pattern having a loop shape entirely surrounding the through-portion in the functional area in a plan view and including zinc, indium and gallium,
wherein the through-portion is connected from a lower surface of the base substrate to an upper surface of the base substrate.

26. The display device of claim 25, wherein the base substrate defines a trench which overlaps the metal oxide pattern in a plan view.

27. The display device of claim 25, further comprising an organic film which covers the pixel array,
wherein the metal oxide pattern defines a slit, and a portion of the organic film passes through the slit to extend toward the base substrate.

* * * * *